US012590384B2

(12) United States Patent
Zhang et al.

(10) Patent No.: US 12,590,384 B2
(45) Date of Patent: Mar. 31, 2026

(54) THERMAL STABLE, ONE-DIMENSIONAL HEXAGONAL-PHASE VANADIUM SULFIDE NANOWIRES AND METHODS FOR PREPARING THE SAME

(71) Applicant: City University of Hong Kong, Hong Kong (HK)

(72) Inventors: Hua Zhang, Hong Kong (HK); Yi Ren, Hong Kong (HK)

(73) Assignee: City University of Hong Kong, Hong Kong (HK)

( * ) Notice: Subject to any disclaimer, the term of this patent is extended or adjusted under 35 U.S.C. 154(b) by 278 days.

(21) Appl. No.: 18/523,934

(22) Filed: Nov. 30, 2023

(65) Prior Publication Data

US 2025/0179684 A1 Jun. 5, 2025

(51) Int. Cl.
| | |
|---|---|
| *C30B 25/02* | (2006.01) |
| *B82Y 40/00* | (2011.01) |
| *C30B 25/00* | (2006.01) |
| *C30B 29/46* | (2006.01) |
| *C30B 29/62* | (2006.01) |

(52) U.S. Cl.
CPC ............ *C30B 25/005* (2013.01); *B82Y 40/00* (2013.01); *C30B 29/46* (2013.01); *C30B 29/62* (2013.01)

(58) Field of Classification Search
CPC ....... C30B 29/62; C30B 29/40; C30B 26/005; B82Y 40/00
See application file for complete search history.

(56) References Cited

PUBLICATIONS

Guang Yang et al "Superior Li-ion storage of VS4 nanowires anchored on reduced graphene" Nanoscale, 2019, 11, 9556-9562 2019.*

Yang et al "Poplar flower-like nitrogen-doped carbon nanotube@VS4 composites with excellent sodium storage performance" Inorg. Chem. Front., 2020, 7, 4883-4891.*

Sumio Iijima, Helical microtubules of graphitic carbon, Nature, 1991, vol. 354, p. 56-58.

R. S. Wagner et al., Vapor-Liquid-Solid Mechanism of Single Crystal Growth, Applied Physics Letters, 1964, vol. 4, No. 5, p. 89-90.

Junhao Lin et al., Flexible metallic nanowires with self-adaptive contacts to semiconducting transition-metal dichalcogenide monolayers, Nature Nanotechnology, 2014, vol. 9, p. 436-442.

(Continued)

*Primary Examiner* — Robert M Kunemund
(74) *Attorney, Agent, or Firm* — Idea Intellectual Limited; Sam T. Yip

(57) ABSTRACT

The present invention provides a general salt-assisted chemical vapor deposition (SA-CVD) synthetic method for the high-yield preparation of 1D hexagonal-phase $M_xV_6S_8$ (M=K, Rb, Cs) and $K_xV_6S_ySe_{8-y}$ nanowires. The resulting nanowires exhibit typical metallic properties, which can be used as a good van der Waals contact for achieving high-performance fermi level pinning free transistors. The present synthesis method allows a more systematic investigation of the intrinsic properties of hexagonal-phase $V_6S_8$ structures.

18 Claims, 32 Drawing Sheets

(56)          References Cited

PUBLICATIONS

Hong En Lim et al., Wafer-Scale Growth of One-Dimensional Transition-Metal Telluride Nanowires, Nano Letters, 2021, vol. 21, p. 243-249.

Youngdong Yoo et al., Ultrathin One-Dimensional Molybdenum Telluride Quantum Wires Synthesized by Chemical Vapor Deposition, Chemistry of Materials, 2020, vol. 32, p. 9650-9655.

Damien Voiry et al., Low-dimensional catalysts for hydrogen evolution and CO2 reduction, Nature Reviews Chemistry, 2018, vol. 2, No. 0105, p. 1-17.

Latha Venkataraman et al., Molybdenum Selenide Molecular Wires as One-Dimensional Conductors, Physical Review Letters, 1999, vol. 83, No. 25, p. 5334-5337.

Ye Chen et al., Phase engineering of nanomaterials, Nature Reviews Chemistry, 2020, vol. 4, p. 243-256.

Omar Fuentes et al., Synthesis, Structural Analysis, and Superconductivity of BaxV6S8, Chemistry of Materials, 2001, vol. 13, No. 9, p. 3051-3056.

K.D. Bronsema et al., Structures and Some Physical Properties of Phases in the System K—V—S: K0.2V6S8 and K0.6VS2, Materials Research Bulletin, 1987, vol. 22, p. 1073-1080.

W. Bensch et al., Crystal and electronic structure of TlxV6S8: relation between thallium abundance and the thallium environment, Journal of Alloys and Compounds, 1992, vol. 178, p. 193-204.

Shisheng Li et al., Halide-assisted atmospheric pressure growth of large WSe2 and WS2 monolayer crystals, Applied Materials Today, 2015, vol. 1, p. 60-66.

Jiadong Zhou et al., A library of atomically thin metal chalcogenides, Nature, 2018, vol. 556, p. 355-359.

Biao Qin et al., General low-temperature growth of two-dimensional nanosheets from layered and nonlayered materials, Nature Communications, 2023, vol. 14, No. 304, p. 1-12.

Jiawen You et al., Salt-Assisted Selective Growth of H-phase Monolayer VSe2 with Apparent Hole Transport Behavior, Nano Letters, 2022, vol. 22, p. 10167-10175.

Zhuangchai Lai et al., Salt-Assisted 2H-to-1T' Phase Transformation of Transition Metal Dichalcogenides, Advanced Materials, 2022, vol. 34, No. 2201194, p. 1-7.

Jiadong Zhou et al., Heterodimensional superlattice with in-plane anomalous Hall effect, Nature, 2022, vol. 609, p. 46-51.

Qingqing Ji et al., Metallic Vanadium Disulfide Nanosheets as a Platform Material for Multifunctional Electrode Applications, Nano Letters, 2017, vol. 17, p. 4908-4916.

Jiangtan Yuan et al., Facile Synthesis of Single Crystal Vanadium Disulfide Nanosheets by Chemical Vapor Deposition for Efficient Hydrogen Evolution Reaction, Advanced Materials, 2015, vol. 27, p. 5605-5609.

Yubin Li et al., Polarization-Sensitive Photodetector Based on High Crystallinity Quasi-1D BiSel Nanowires Synthesized via Chemical Vapor Deposition, Small, 2023, No. 2302623, p. 1-9.

Yang Lu et al., Synthesis and Broadband Photodetection of a P-Type 1D Van der Waals Semiconductor HfSnS3, Small, 2023, No. 2303903, p. 1-10.

W. Bensch et al., Magnetic properties in the series TlxV6-yMyS8 (M = Cr, Mn, Fe;0 ≤ y ≤ 1), Solid State Communications, 1986, vol. 58, No. 9, p. 631-635.

Zhuangchai Lai et al., Metastable 1T'-phase group VIB transition metal dichalcogenide crystals, Nature Materials, 2021, vol. 20, p. 1113-1120.

Xiankun Zhang et al., Molecule-Upgraded van der Waals Contacts for Schottky-Barrier-Free Electronics, Advanced Materials, 2021, vol. 33, No. 2104935, p. 1-10.

Yan Wang et al., Van der Waals contacts between three-dimensional metals and two-dimensional semiconductors, Nature, 2019, vol. 568, p. 70-74.

Xiankun Zhang et al., All-van-der-Waals Barrier-Free Contacts for High-Mobility Transistors, Advanced Materials, 2022, vol. 34, No. 2109521, p. 1-10.

* cited by examiner

THERMAL STABLE, ONE-DIMENSIONAL HEXAGONAL-PHASE VANADIUM SULFIDE NANOWIRES AND METHODS FOR PREPARING THE SAME

FIELD OF THE INVENTION

The present invention generally relates to at least the fields of materials science, nanomaterial synthesis, chemical synthesis techniques, crystal structure research, and potential applications in catalysis and electronic devices. More specifically, the present invention relates to salt-assisted synthesis of one-dimensional hexagonal-phase vanadium sulfide nanowires.

BACKGROUND OF THE INVENTION

Over the past decade, transition metal-chalcogenides (TMCs) have garnered significant attention for their potential in applications such as gas sensing, catalysis, optoelectronics, energy storage, and as an ideal platform for fundamental research on layered quantum systems. One-dimensional (1D) TMCs nanowires, such as $M_6X_6$(M: Mo or W and X: S, Se, or Te) nanowires, have been extensively investigated due to their fascinating crystal structure and the resulting distinctive physical and chemical properties[1-5]. These properties have led to various possible applications, including catalysis (e.g., hydrogen evolution reaction)[6] and electronics (e.g., van der Waals contact for two-dimensional (2D) semiconductors)[7-8].

As a typical type of transition metal chalcogenide, vanadium sulfides have various compositions, including VS, $VS_2$, $V_2S_3$, $V_3S_4$, $V_5S_8$, and $V_6S_8$, some of which can crystallize into different phases with distinct physicochemical properties. For instance, $V_6S_8$ exhibits two polymorphs, monoclinic and hexagonal. However, the majority of studies have predominantly focused on synthesizing $VS_2$, and the synthesis of other vanadium sulfides, especially $V_6S_8$, has been rarely reported.

The nonstoichiometric $M_xV_6S_8$ (M=K, Rb, Cs) crystals crystallize in a hexagonal structure, which is composed of $VS_6$ octahedra linked together by shared edges and faces, forming large hexagonal channels running parallel to the c-axis[9-11]. These channels can accommodate a variety of atoms, including K, Rb, Cs, etc., allowing for the fine-tuning of the electronic configuration of the structure. For instance, Prof. Zheng Chong, et al. reported a flux growth method for the synthesis of $Ba_xV_6S_8$ crystals. Specifically, the BaS, V, S, and KCl powders were mixed in an evacuated quartz ampoule, and then heated the ampoule for 6 days[9]. However, the reaction time throughout the entire synthesis process is too long, which is not conducive to industries that require large-scale production; and Prof. G. A. Wiegers, et al. reported a closed-system gas-solid method for the synthesis of $K_{0.2}V_6S_8$ crystals. Specifically, the $K_2S$, V, and S powders were mixed in an evacuated quartz ampoule, and then heated the ampoule at 1200 K for about a week. Besides, the walls of the quartz ampoules were severely destroyed during the reaction process, which makes the synthesis very challenging[10]. Although several synthetic strategies have been reported to prepare hexagonal-phase $M_xV_6S_8$ bulk crystals, including the closed-system gas-solid method and ion exchange method, these methods usually require complex procedures, multiple steps, and a long reaction time of up to one week and can only produce limited types of $M_xV_6S_8$ crystals with low yield[9-11].

Salt-assisted chemical vapor deposition (SA-CVD) techniques, utilizing salts or molten salts as precursors, offer a robust approach with significant potential for synthesizing 1D materials. These methods effectively lower the melting points of the precursors, enhance vapor pressure, and accelerate growth speed[12-15]. In comparison to conventional CVD methods, SA-CVD methods exhibit distinct advantages in the production of 1D TMC nanowires, resulting in increased yield and improved reproducibility[4, 16]. Nevertheless, the application of SA-CVD as a universal strategy for synthesizing 1D hexagonal-phase $M_xV_6S_8$ nanowires remains unexplored. Hence, there is a strong desire to develop a universal method for synthesizing hexagonal-phase $M_xV_6S_8$ nanowires with a high yield.

SUMMARY OF THE INVENTION

To address the aforementioned drawbacks, the present invention develops a novel CVD method to synthesize $V_6S_8$ crystals with specific morphology and crystal phases.

This invention offers a straightforward CVD method for synthesizing one-dimensional (1D) nonstoichiometric hexagonal-phase vanadium sulfide nanowires with high yield, high conductivity and high catalytic activity. In the structure, $VS_6$ octahedral units are interconnected by sharing faces and edges to form a stable three-dimensional (3D) $V_6S_8$ network with hexagonal channels parallel to the c-axis. The diameter of the channels is large enough to accommodate different atoms, such as K, Rb, Cs, etc.

In a first aspect, the present invention provides a thermal stable, one dimensional hexagonal-phase $M_xV_yS_z$ nanowire, where M is potassium (K), rubidium (Rb), or cesium (Cs); x is about 0.2 or 1.12; y is 6; z is 8. The thermal stable, one dimensional hexagonal-phase $M_xV_yS_z$ nanowire has c-axis-aligned hexagonal channels. The thermal stable, one dimensional hexagonal-phase $M_xV_yS_z$ nanowire exhibits an unchanged Raman spectrum in a temperature range of 30 to 300° C. Preferably, y is 6 and z is 8.

In accordance with one embodiment, the c-axis-aligned hexagonal channels have diameters in a range of 5 Å to 10 Å.

In accordance with one embodiment, the thermal stable, one dimensional hexagonal-phase $M_xV_yS_z$ nanowire functions as effective van der Waals contacts for $MoS_2$-based field-effect transistors, with good ohmic contact, large charge mobility, and reduced Fermi-level pinning effect.

In accordance with one embodiment, the $M_xV_yS_z$ nanowire has a thickness ranging from 1-15 nm.

In accordance with another embodiment, the $M_xV_yS_z$ nanowire is $K_{0.2}V_6S_8$, exhibiting five distinctive Raman peaks recorded at 532 nm, comprising 169.4, 221.5, 326.7, 340.0, and 374.1 $cm^{-1}$, respectively.

In a second aspect, the present invention provides a thermal stable, one dimensional hexagonal-phase $K_xV_6S_ySe_{8-y}$ nanowire, where x is about 0.68 or 1.34; y is 7.02 or 6.79. The thermal stable, one dimensional hexagonal-phase $M_xV_yS_z$ nanowire has c-axis-aligned hexagonal channels. The thermal stable, one dimensional hexagonal-phase $K_xV_6S_ySe_{8-y}$ nanowire exhibits an unchanged Raman spectrum in a temperature range of 30 to 300° C.

In accordance with one embodiment, the c-axis-aligned hexagonal channels have diameters in a range of 5 Å to 10 Å.

In accordance with one embodiment, the thermal stable, one dimensional hexagonal-phase $K_xV_6S_ySe_{8-y}$ nanowire functions as effective van der Waals contacts for $MoS_2$- based field-effect transistors, with good ohmic contact, large charge mobility, and reduced Fermi-level pinning effect.

In accordance with one embodiment, the $K_xV_6S_ySe_{8-y}$ nanowire is $K_{0.68}V_6S_{7.02}Se_{0.98}$, exhibiting five distinctive Raman peaks recorded at 532 nm, comprising 165.2, 221.3, 328.4, 337.9, and 375.7 cm$^{-1}$, respectively.

In accordance with another embodiment, the $K_xV_6S_ySe_{8-y}$ nanowire is $K_{1.34}V_6S_{6.79}Se_{1.21}$, exhibiting five distinctive Raman peaks recorded at 532 nm, comprising 157.5, 213.6, 328.4, 337.9, and 370.1 cm$^{-1}$, respectively.

In a third aspect, the present invention provides a salt-assisted method for synthesizing one-dimensional hexagonal-phase vanadium sulfide nanowires on a substrate, including the steps of:

preparing a substrate;

providing a precursor by mixing vanadium (V) and sulfur (S) compounds;

introducing a metal salt to the precursor via a chemical vapor deposition (SA-CVD) method to obtained a mixture;

transferring the mixture to a quartz boat and covering two pieces of fresh-cleaved fluorophlogopite mica substrates on top of loaded mixture;

transferring the quartz boat to the center of a quartz tube, and then introducing Ar and H$_2$ to provide an optimal synthesis atmosphere;

heating the quartz tube and then cooling the quartz boat down to room temperature; and growing the one dimensional hexagonal-phase $M_xV_6S_8$ nanowires and $K_xV_6S_ySe_{8-y}$ nanowires on the substrate.

In accordance with one embodiment, the ratio between the precursor and the metal salt is in a range of 1:1 to 1:1.5.

In accordance with one embodiment, the step of providing a precursor comprises mixing V$_2$S$_3$ powders and S powders.

In accordance with one embodiment, the substrate is a mica substrate.

In accordance with one embodiment, the metal salt is selected from the group consisting of KCl, K$_2$S, K$_2$CO$_3$, KHCO$_3$, K$_2$C$_2$O$_4$·H$_2$O, Rb$_2$CO$_3$, and Cs$_2$CO$_3$.

In accordance with one embodiment, the quartz tube is purged with 500 s.c.c.m for 20 minutes in advance to remove internal air and moisture.

In accordance with one embodiment, the flow rate ratio between the Ar and H$_2$ is 4:1.

In accordance with one embodiment, the precursor further includes Selenium (Se) compounds.

Compared to existing technologies, the present invention offers the following major advantages:

(1) The developed synthetic strategy employs a highly robust and straightforward salt-assisted CVD method, enabling the large-scale preparation of 1D hexagonal-phase $M_xV_6S_8$ nanowires with exceptional yield and reproducibility. This method can be readily upscaled through the utilization of larger CVD furnaces, showcasing promising potential for the future electronic industry.

(2) The present invention provides a universal approach for the direct synthesis of a range of 1D MxV6S8 nanowires featuring the same 3D V6S8 network but varying atoms within the hexagonal channels.

BRIEF DESCRIPTION OF THE DRAWINGS

Embodiments of the present invention are described in more detail hereinafter with reference to the drawings, in which.

DETAILED DESCRIPTION

Figure 1A:
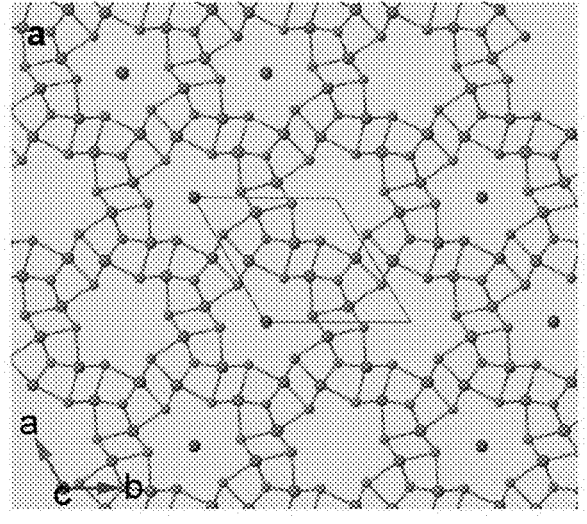
FIG. 1A depicts a schematic illustration of hexagonal-phase $M_xV_6S_8$ structure along the c-axis.

The present invention will be described in detail through the following embodiments with appending drawings. It should be understood that the specific embodiments are provided for an illustrative purpose only, and should not be interpreted in a limiting manner. Those skilled in the art will appreciate that the invention described herein is susceptible to variations and modifications other than those specifically described.

The invention includes all such variation and modifications. The invention also includes all of the steps and features referred to or indicated in the specification, individually or collectively, and any and all combinations or any two or more of the steps or features. Other aspects and advantages of the invention will be apparent to those skilled in the art from a review of the ensuing description.

One-dimensional (1D) transition-metal chalcogenides (TMCs) are garnering growing scientific and technological interest, particularly for applications in ultrasmall electronic interconnects and highly active catalysts. Nevertheless, the range of available TMC nanowires is still quite limited, and the synthesis of new 1D TMC nanowires remains a highly challenging endeavor.

Until now, the majority of research efforts have predominantly concentrated on synthesizing $VS_2$, with limited attention given to other vanadium sulfides, notably $V_6S_8$, due to the intricate growth conditions. Only a handful of studies have reported the closed-system gas-solid synthesis of the $V_6S_8$ structure. Nonetheless, the previous gas-solid method typically involves complex procedures, multiple steps, and an extended reaction time of up to one week, rendering the synthesis process intricate and time-consuming. Furthermore, this method cannot be employed as a universal approach for producing various $M_xV_6S_8$ structures.

In light of this, the present invention introduces a thermal stable, one dimensional hexagonal-phase $M_xV_yS_z$ nanowire, where M is potassium (K), rubidium (Rb), or cesium (Cs); x is about 0.2 or 1.12; y is 6; z is 8. The thermal stable, one dimensional hexagonal-phase $M_xV_yS_z$ nanowire has c-axis-aligned hexagonal channels. The thermal stable, one dimensional hexagonal-phase $M_xV_yS_z$ nanowire exhibits an unchanged Raman spectrum in a temperature range of 30 to 300° C. Preferably, y is 6 and z is 8.

These nanowires serve as effective van der Waals contacts for $MoS_2$-based field-effect transistors with good ohmic contact, large charge mobility and reduced Fermi-level pinning effect.

The CVD-synthesized hexagonal-phase $M_xV_6S_8$ structures are promising for superconductivity due to their large c-axis-aligned channels that can accommodate various ions, allowing for precise electronic configuration adjustments and improved superconducting properties.

The present invention also provides a thermal stable, one dimensional hexagonal-phase $K_xV_6S_ySe_{8-y}$ nanowire, where x is about 0.68 or 1.34; y is 7.02 or 6.79. The thermal stable, one dimensional hexagonal-phase $M_xV_yS_z$ nanowire has c-axis-aligned hexagonal channels. The thermal stable, one dimensional hexagonal-phase $K_xV_6S_ySe_{8-y}$ nanowire exhibits an unchanged Raman spectrum in a temperature range of 30 to 300° C.

Additionally, the present invention further provides a general salt-assisted chemical vapor deposition (SA-CVD) synthetic method for the high-yield preparation of 1D hexagonal-phase $M_xV_6S_8$ and $K_xV_6S_ySe_{8-y}$ nanowires on the mica substrate. The method includes preparing a substrate; providing a precursor by mixing vanadium (V) and sulfur (S) compounds; introducing a metal salt to the precursor via a chemical vapor deposition (SA-CVD) method to obtained a mixture; transferring the mixture to a quartz boat and covering two pieces of fresh-cleaved fluorophlogopite mica substrates on top of loaded mixture; transferring the quartz boat to the center of a quartz tube, and then introducing Ar and H2 to provide an optimal synthesis atmosphere; heating the quartz tube and then cooling the quartz boat down to room temperature; and growing the one dimensional hexagonal-phase MxV6S8 nanowires and KxV6SySe8-y nanowires on the substrate. The chemical vapor deposition (CVD) method offers a controllable approach to synthesize vanadium chalcogenide crystals with different compositions, sizes, morphologies, and phases by tuning the growth parameters. The present invention introduces, for the first time, the direct CVD growth of $V_6S_8$ crystals, overcoming the complex and challenging-to-control growth conditions.

Some easily accessible metal salts include, but are not limited to, $KHCO_3$, $KCl$, $K_2S$, $K_2CO_3$, $K_2C_2O_4 \cdot H_2O$ (for synthesizing $K_xV_6S_8$ nanowires), $Rb_2CO_3$ (for synthesizing $Rb_xV_6S_8$ nanowires), and $Cs_2CO_3$ (for synthesizing $Cs_xV_6S_8$ nanowires), can be utilized to synthesize the 1D hexagonal-phase nanowires.

The as-prepared nanowires are single crystalline, which is characterized by X-ray diffraction (XRD), high-resolution transmission electron microscopy (HRTEM), aberration-corrected high-angle annular dark-field (HAADF) scanning transmission electron microscopy (STEM), selected-area electron diffraction (SAED) and Raman spectroscopy.

Figure 1B:
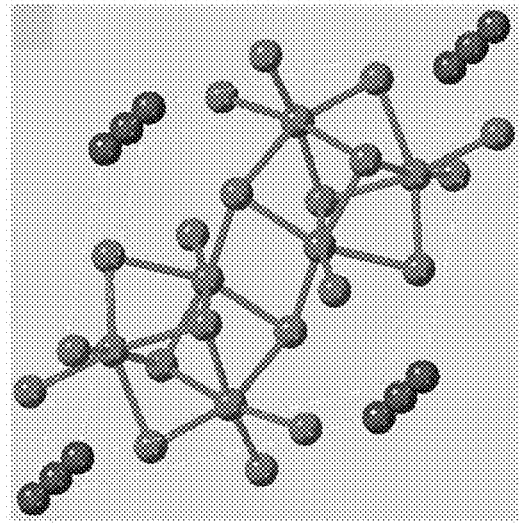
FIG. 1B depicts a schematic illustration of a unit cell of the hexagonal-phase $M_xV_6S_8$ structure.
Figure 1C:
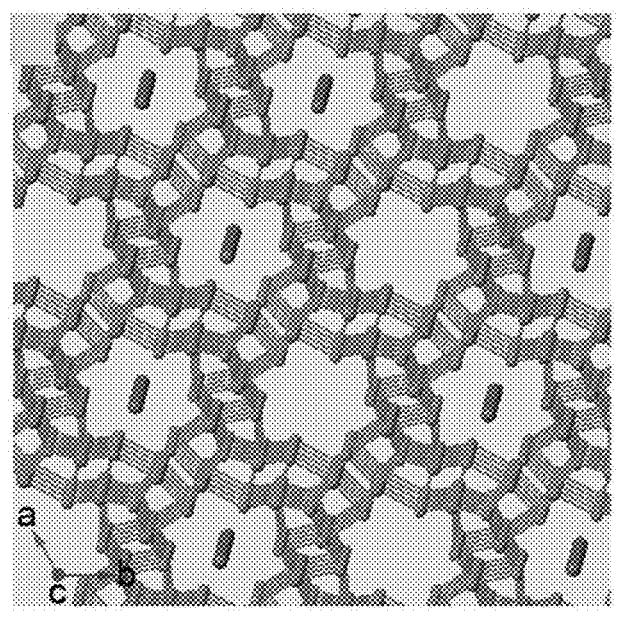
FIG. 1C depicts a three-dimensional (3D) schematic illustration of hexagonal-phase $M_xV_6S_8$ structure along the c-axis.

The nonstoichiometric $M_xV_6S_8$ (M=K, Rb, Cs) crystals crystallize in a hexagonal structure with a space group $P6_3/m$. Referring to FIG. 1A, the region marked by black lines corresponds to the unit cell of the hexagonal-phase $M_xV_6S_8$ structure. Six sulfur atoms coordinate with each vanadium atom, and the unit cell is composed of two octahedral trimers connected by sharing an octahedral edge (FIG. 1B). Turning to FIG. 1C, $VS_6$ octahedra units are joined together by sharing faces and edges to create a stable three-dimensional $V_6S_8$ network with hexagonal channels parallel to the c-axis[9-11]. The diameter of the channels is approximately 6.2 Å, which is sufficiently large to accommodate various atoms, including K, Rb, Cs, and others. Different alkali-metal atoms can form columns within the hexagonal channels.

Figure 2:
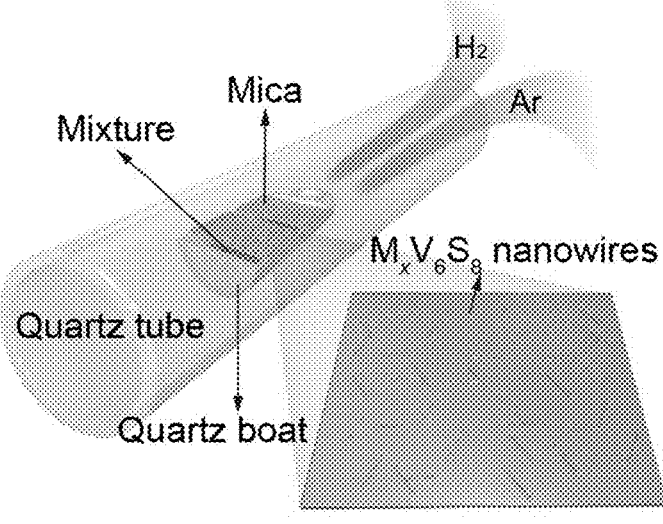
FIG. 2 depicts a schematic diagram of the experimental setup used for synthesizing 1D hexagonal-phase $M_xV_6S_8$ wnanowires.

Despite the significant amount of space available in the channel, the voids are not completely occupied. FIG. 2 depicts a schematic diagram of the salt-assisted CVD method used to synthesize 1D hexagonal-phase $M_xV_6S_8$ nanowires. More specifically, the commercially available $V_2S_3$ powders, S powders, and one of the following metal salts including $KCl$, $K_2S$, $K_2CO_3$, $KHCO_3$, $K_2C_2O_4 \cdot H_2O$ (for synthesizing $K_xV_6S_8$ nanowires), $Rb_2CO_3$ (for synthesizing $Rb_xV_6S_8$ nanowires), or $Cs_2CO_3$ (for synthesizing $Cs_xV_6S_8$ nanowires) with a certain molar ratio are mixed and then ground using an agate mortar. After that, the obtained homogenous mixture is covered by two pieces of fresh-cleaved fluorophlogopite mica substrates and then heated under the gas flow of 80% Ar and 20% $H_2$ at 820-850° C. for 1-10 minutes.

In summary, a straightforward, practical, robust, and versatile SA-CVD strategy has been developed to enable the high-yield synthesis of 1D hexagonal-phase $M_xV_6S_8$ and $K_xV_6S_ySe_{8-y}$ nanowires. Beyond $KHCO_3$, it has been observed that several other metal salts, including $KCl$, $K_2S$, $K_2CO_3$, $K_2C_2O_4 \cdot H_2O$ (for the synthesis of $K_xV_6S_8$ nanowires), $Rb_2CO_3$ (for the production of $Rb_xV_6S_8$ nanowires), and $Cs_2CO_3$ (for the formation of $Cs_xV_6S_8$ nanowires), can also be employed in the synthesis of 1D hexagonal-phase $M_xV_6S_8$ nanowires. Moreover, this method has also been used to prepare hexagonal-phase alloys, such as $K_xV_6S_ySe_{8-y}$ nanowires.

The following examples illustrate the present invention and are not intended to limit the same.

EXAMPLE

Example 1—Material and Methods

Chemicals

Vanadium sulfide ($V_2S3$, 99.9%), potassium sulfide anhydrous ($K_2S$, analytical reagent), and potassium chloride (KCl, 99.5%) were purchased from Macklin (China). Potassium carbonate ($K_2CO_3$, 99%), cesium carbonate ($Cs_2CO_3$, 99.9%), rubidium carbonate ($Rb_2CO_3$, 99.8%), and sulfur powder (S, 99.98%) were purchased from Sigma-Aldrich (Germany). Potassium bicarbonate ($KHCO_3$, 99.9%), potassium oxalate monohydrate ($K_2C_2O_4 \cdot H_2O$, 99.8%), and selenium powder (Se, ≥99.99%) were purchased from Aladdin (China). Ultra-high purity (99.999%) $H_2$ and Ar were purchased from Linde HKO Limited (Hong Kong, China). All the chemicals were used as received without any purification.

Characterization

Optical images were obtained on an optical microscope (Nikon, LV100ND, Japan). Scanning electron microscope (SEM) images were acquired on a scanning electron microscope (Thermo Fisher Scientific, QUATTRO S). The Bruker Icon atomic force microscopy (AFM) system was used to conduct AFM measurements in an atmospheric environment and the AFM height profiles were obtained by an AFM tip (OTESPA-R3, Bruker Nano Inc., USA) under the tapping mode. X-ray diffraction (XRD) patterns were recorded with a Rigaku SmartLab X-ray diffractometer, using a Cu Kα radiation source ($\lambda$=1.5406 Å). The samples used for XRD characterization were prepared by transferring the as-prepared hexagonal-phase nanowires from mica substrates to freshly cleaned glass substrates. Transmission electron microscope (TEM) images, high-resolution TEM (HRTEM) images, and selected area electron diffraction (SAED) patterns were taken on a JEOL JEM-2100F (JEOL, Tokyo, Japan) transmission electron microscope. The high-angle annular dark-field scanning TEM (HAADF-STEM) images were captured on a JEOL ARM200F (JEOL, Tokyo, Japan) spherical aberration-corrected transmission electron microscope with a cold field emission gun and an advanced aberration corrector. The acceleration voltage utilized during the operation of all TEMs was 200 kV. Samples for cross-sectional analysis were produced with a focused ion beam (FIB) system (JEOL JIB-4500) and subsequently transferred onto holey carbon-coated Cu grids. Energy dispersive X-ray spectroscopy (EDS) data were collected by using the JEOL JEM-2100F microscope. Raman spectra, Raman mapping images, and photoluminescence (PL) spectra were obtained on a conformal Raman microscope (Renishaw inVia™) with an excitation wavelength of 532 nm and laser spot diameter of about 1 μm. Angle-resolved Raman spectroscopy measurements were carried out by maintaining the polarized laser constant and incrementally rotating the samples by 15°. X-ray photoelectron spectroscopy (XPS) spectra were acquired on the ESCALAB 250Xi (Thermo Fisher Scientific) instrument and the XPS results were calibrated by utilizing the C is peak with a binding energy of 284.8 eV as the reference. The samples used for XPS characterization were prepared by transferring the as-prepared hexagonal-phase nanowires from mica substrates to freshly cleaned Si substrates.

Example 2—Synthesis of 1D $M_xV_6S_8$ Nanowires

Synthesis of 1D $K_xV_6S_8$ Nanowires 1 mmol of $V_2S_3$ powders, 1.5 mmol of $KHCO_3$ powders, and 10 mmol of S powders were blended uniformly and then ground for at least 20 minutes utilizing an agate mortar. 20 mg of the obtained mixed powder was transferred to a quartz boat and then two pieces of fresh-cleaved fluorophlogopite mica substrates were precisely covered on the top of the loaded mixture. Then, the quartz boat was transferred to the center of a quartz tube (1 inch in diameter). Before heating, the tube was purged with 500 s.c.c.m (standard cubic centimeter per minute) for 20 minutes to remove the air and moisture inside it, and then with 80 s.c.c.m Ar and 20 s.c.c.m $H_2$ for 20 minutes to provide an optimal synthesis atmosphere. Subsequently, the tube was inserted into the tube furnace that had been heated to 850° C. and maintained for 6 minutes. After that, the tube furnace was removed from the reaction zone and switched off and the boat was cooled down to room temperature naturally. Finally, the one-dimensional (1D) $K_xV_6S_8$ nanowires were synthesized on the mica substrate. It is worth noting that the 1D hexagonal-phase $K_xV_6S_8$ nanowires could also be synthesized by replacing $KHCO_3$ with other metal salts such as $K_2S$, KCl, $K_2CO_3$, and $K_2C_2O_4·H_2O$ while keeping the other growth parameters constant.

Synthesis of 1D $Rb_xV_6S_8$ Nanowires 1 mmol of $V_2S_3$ powders, 1.6 mmol of $Rb_2CO_3$ powders, and 5 mmol of S powders were blended uniformly and then ground for at least 20 minutes utilizing an agate mortar. 20 mg of the obtained mixed powder was transferred to a quartz boat and then two pieces of fresh-cleaved fluorophlogopite mica substrates were precisely covered on the top of the loaded mixture. Then, the quartz boat was transferred to the center of a quartz tube (1 inch in diameter). Before heating, the tube was purged with 500 s.c.c.m (standard cubic centimeter per minute) for 20 minutes to remove the air and moisture inside it, and then with 80 s.c.c.m Ar and 20 s.c.c.m $H_2$ for 20 minutes to provide an optimal synthesis atmosphere. Subsequently, the tube was inserted into the tube furnace that had been heated to 820° C. and maintained for 6 minutes. After that, the tube furnace was removed from the reaction zone and switched off and the boat was cooled down to room temperature naturally. Finally, the 1D $Rb_xV_6S_8$ nanowires were synthesized on the mica substrate.

Synthesis of 1D $Cs_xV_6S_8$ Nanowires 1 mmol of $V_2S_3$ powders, 1.1 mmol of $Cs_2CO_3$ powders, and 5 mmol of S powders were blended uniformly and then ground for at least 20 minutes utilizing an agate mortar. 20 mg of the obtained mixed powder was transferred to a quartz boat and then two pieces of fresh-cleaved fluorophlogopite mica substrates were precisely covered on the top of the loaded mixture. Then, the quartz boat was transferred to the center of a quartz tube (1 inch in diameter). Before heating, the tube was purged with 500 s.c.c.m (standard cubic centimeter per minute) for 20 minutes to remove the air and moisture inside it, and then with 80 s.c.c.m Ar and 20 s.c.c.m $H_2$ for 20 minutes to provide an optimal synthesis atmosphere. Subsequently, the tube was inserted into the tube furnace that had been heated to 850° C. and maintained for 6 minutes. After that, the tube furnace was removed from the reaction zone and switched off and the boat was cooled down to room temperature naturally. Finally, the 1D $Cs_xV_6S_8$ nanowires were synthesized on the mica substrate.

Example 3—Characterization of 1D $M_xV_6S_8$ Nanowires

Figure 3A:
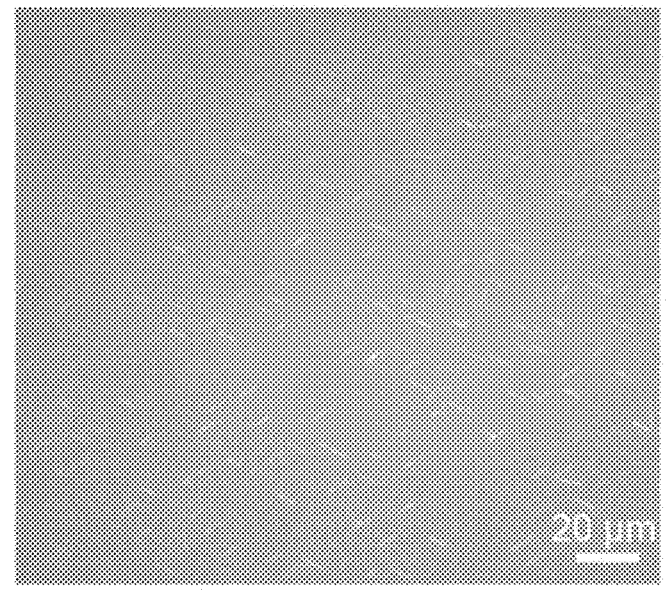
FIG. 3A and FIG. 3B show optical and SEM images of the as-prepared $K_xV_6S_8$ nanowires on the mica substrate. The arrows represent three different preferred growth orientations of nanowires.
Figure 3B:
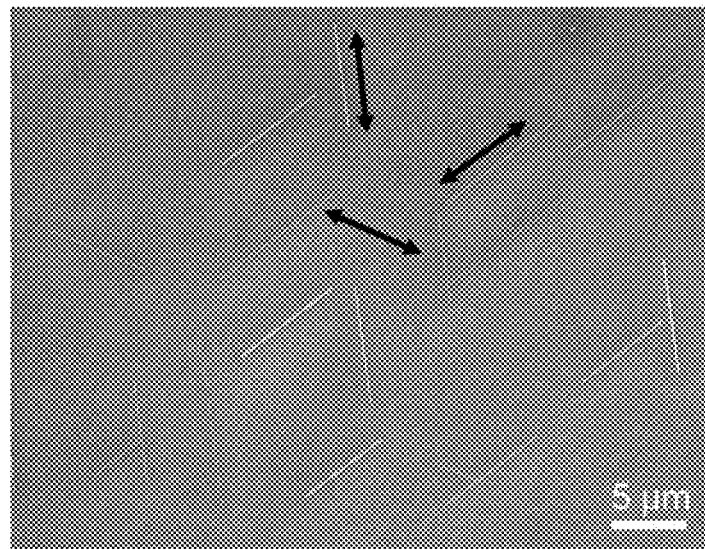
Figure 4:
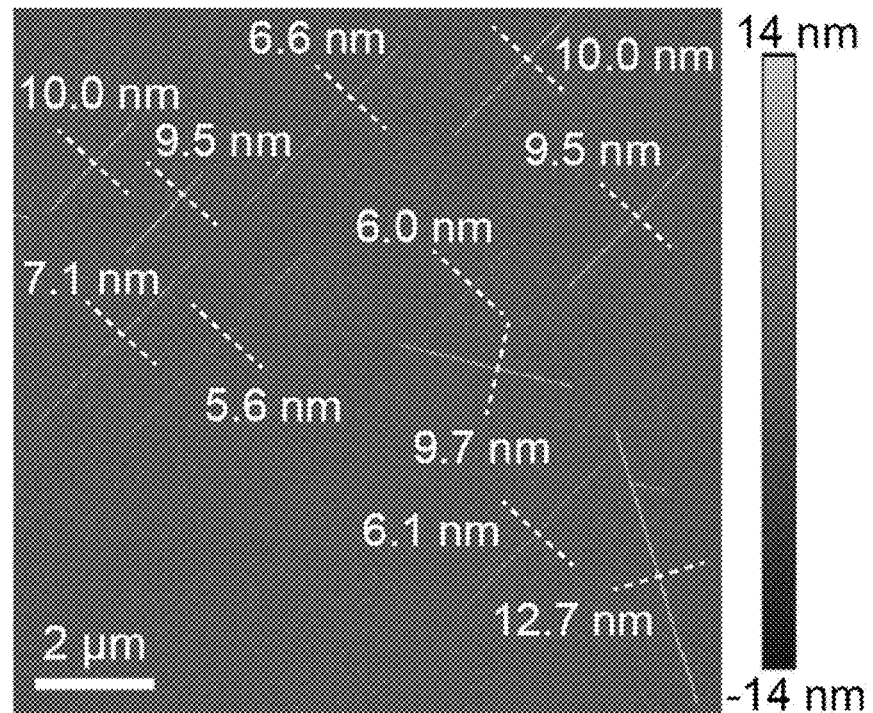
FIG. 4 shows an AFM height image of the as-prepared $K_xV_6S_8$ nanowires on the mica substrate.

As an example, consider $K_xV_6S_8$. FIGS. 3A-3B displayed optical and scanning electron microscope (SEM) images of $K_xV_6S_8$ crystals synthesized with the assistance of $KHCO_3$ on a mica substrate, demonstrating their high yield and exhibiting a clear 1D nanowire morphology with lengths extending to tens of micrometers. It appeared that the growth of $K_xV_6S_8$ nanowires was restricted to three main directions, rather than uniform growth in all directions on the surface of the mica substrate. In addition, the atomic force microscopy (AFM) image in FIG. 4 showed that the $K_xV_6S_8$ nanowires had thicknesses ranging from 5.6 to 12.7 nm, as determined by their height profiles. For instance, the obtained $K_xV_6S_8$ nanowire had a thickness of 5.6 nm, 6.0 nm, 6.1 nm, 6.6 nm, 7.1 nm, 9.5 nm, 9.7 nm, 10.0 nm, or 12.7 nm.

Figure 5:
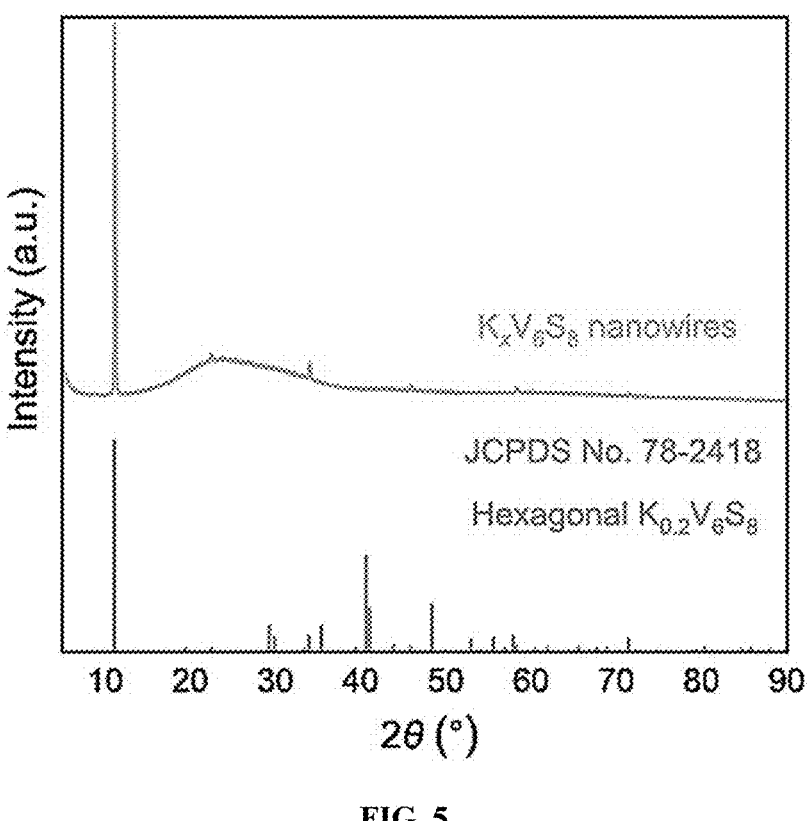
FIG. 5 depicts XRD pattern of the prepared hexagonal-phase $K_xV_6S_8$ nanowires.

To reveal the crystal structure and crystallinity of the prepared $K_xV_6S_8$ nanowires, X-ray diffraction (XRD) was performed on the nanowires synthesized with $KHCO_3$. Referring to FIG. 5, the XRD pattern of hexagonal-phase $K_{0.2}V_6S_8$ crystals was based on the data of JCPDS No. 78-2418. The obtained XRD pattern exhibited six different diffraction peaks, matching well with the (10$\bar{1}$0), (20$\bar{2}$0), (30$\bar{3}$0), (40$\bar{4}$0), (50$\bar{5}$0), and (60$\bar{6}$0) planes of unconventional hexagonal-phase $K_{0.2}V_6S_8$ crystals (JCPDS No. 78-2418). However, only the (10$\bar{1}$0) group planes were discovered. This suggested that the $K_xV_6S_8$ nanowires grow anisotropically perpendicular to the a-axis.

Figure 6A:
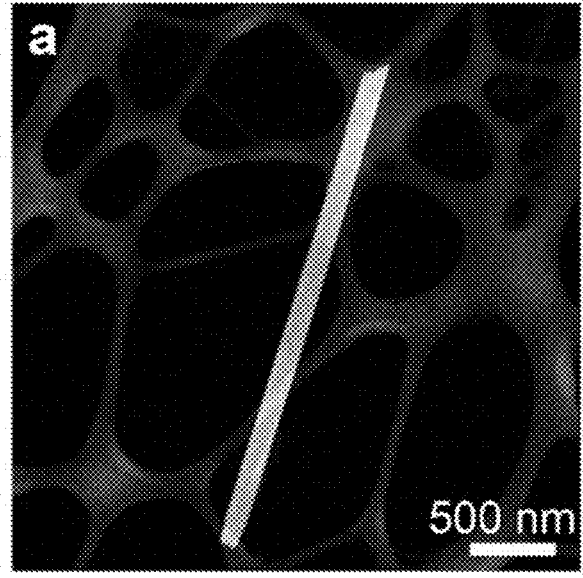
FIG. 6A and FIG. 6B show low-magnification and high-resolution TEM images of a typical hexagonal-phase $K_xV_6S_8$ nanowire along the [1$\bar{1}$00] zone axis.
Figure 6B:
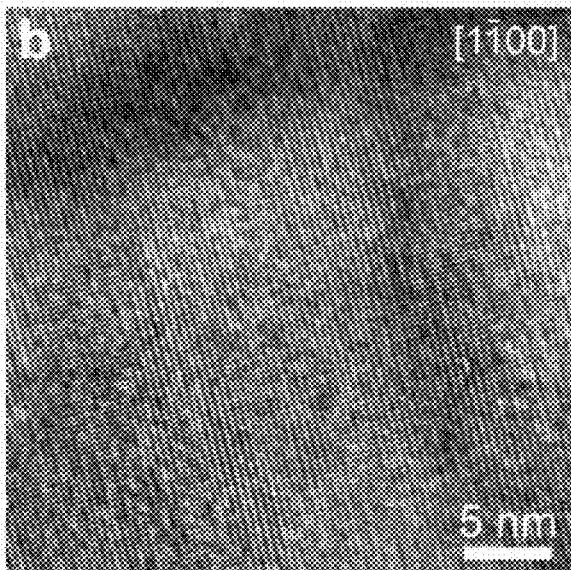
Figure 6C:
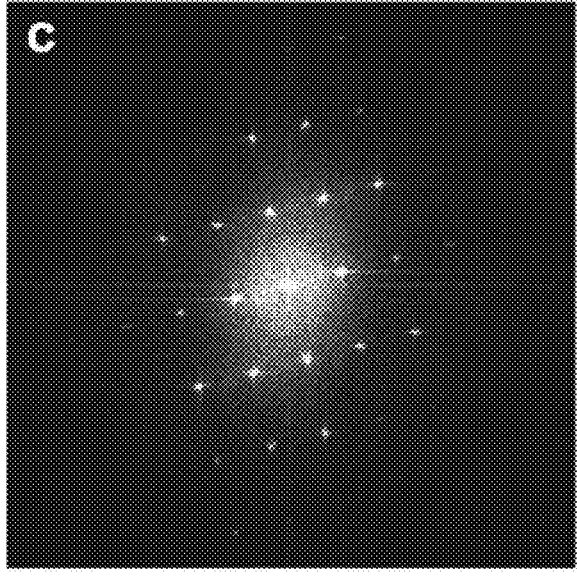
FIG. 6C shows the corresponding FFT pattern taken from the HRTEM image in FIG. 6B.
Figure 6D:
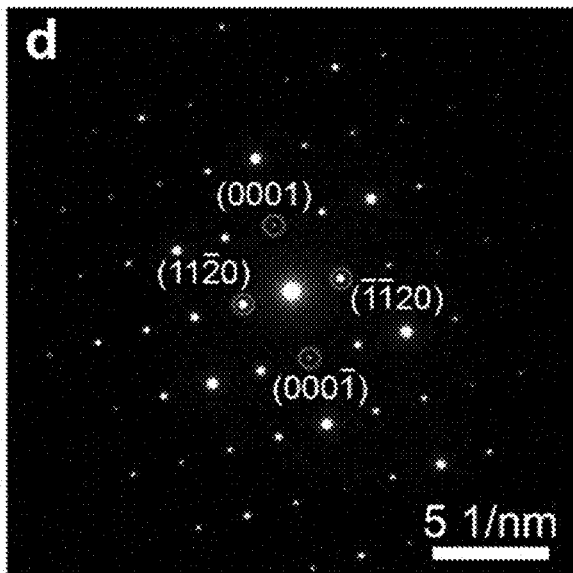
FIG. 6D shows SAED pattern of a typical $K_xV_6S_8$ nanowire.
Figure 7A:
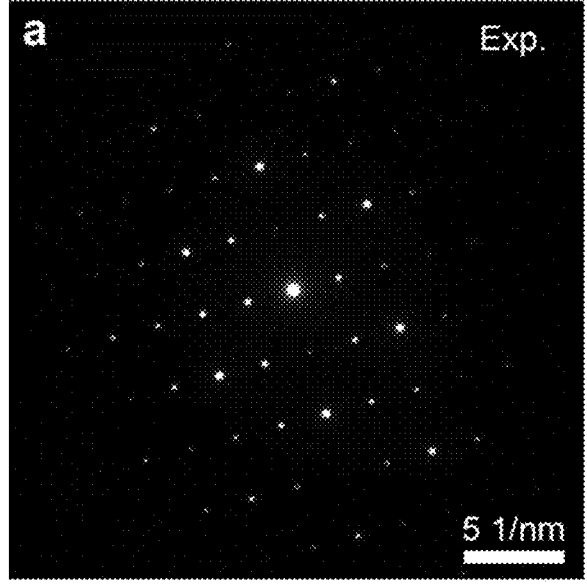
FIG. 7A and FIG. 7B show experimental and simulated SAED patterns of hexagonal-phase KxV6S8 structure along the [1$\bar{1}$00] zone axis, showing a good agreement.
Figure 7B:
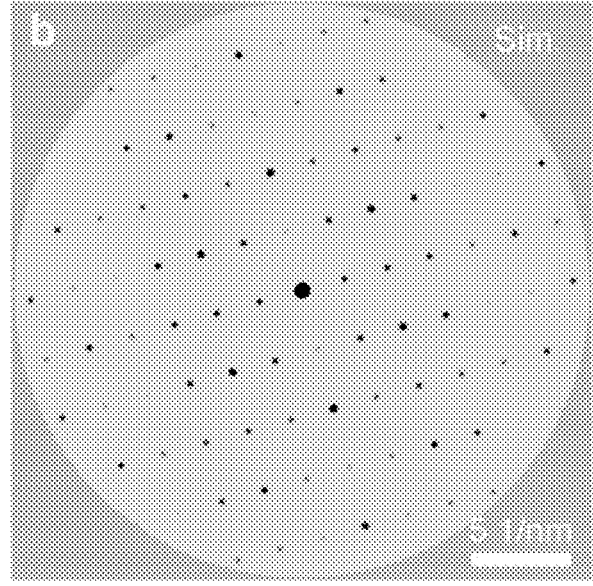

Transmission electron microscopy (TEM) was also performed to investigate the crystal structure and elemental composition of the as-prepared hexagonal $K_xV_6S_8$ nanowires. FIG. 6A showed a low-magnification TEM image of a typical 1D $K_xV_6S_8$ nanowire, which was consistent with the morphology depicted in the optical (FIG. 3A) and SEM (FIG. 3B) images. The high-resolution TEM (HRTEM) image in FIG. 6B indicated the excellent crystallinity of the synthesized $K_xV_6S_8$ nanowire. Correspondingly, the fast Fourier transform (FFT) pattern in FIG. 6C and the selected area electron diffraction (SAED) patterns in FIG. 6D, obtained from different regions of the as-prepared $K_xV_6S_8$ nanowire along the [1$\bar{1}$00] zone axis, showed only one set of sharp diffraction spots, confirming its single-crystal nature and hexagonal phase structure. Turning to FIG. 7A, the SAED result matched well with the simulated SAED pattern (FIG. 7B) for the hexagonal-phase $K_xV_6S_8$ structure along the [1$\bar{1}$00] zone axis.

Figure 8A:
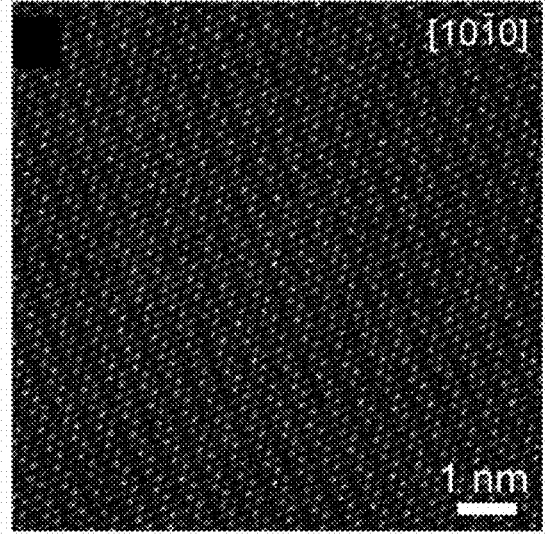
FIG. 8A shows a spherical aberration-corrected HAADF-STEM image of the as-prepared $K_xV_6S_8$ nanowire along the [10$\bar{1}$0] zone axis.
Figure 8B:
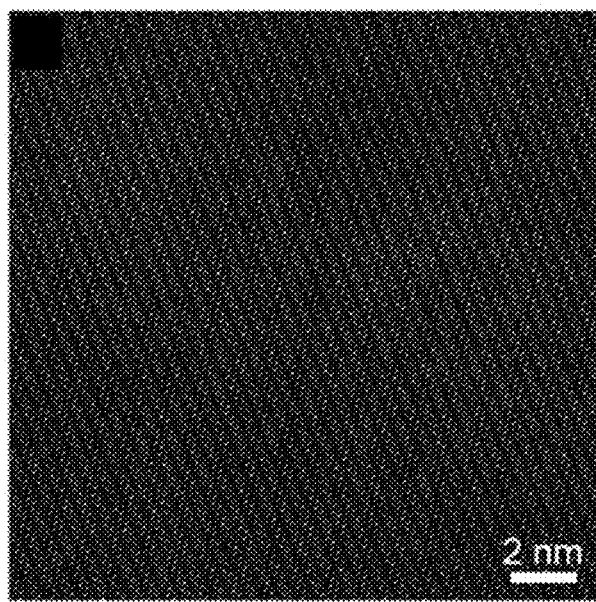
FIG. 8B shows a large-area HAADF-STEM image of the as-prepared $K_xV_6S_8$ nanowire along the [10$\bar{1}$0] zone axis.
Figure 8C:
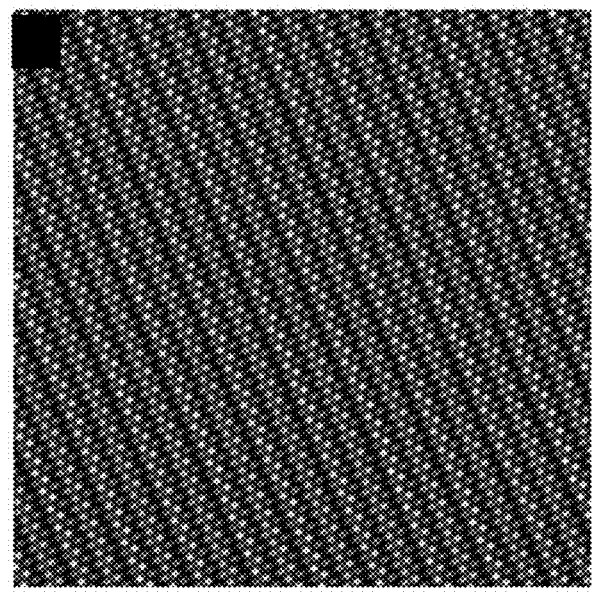
FIG. 8C shows a simulated STEM image of the as-prepared $K_xV_6S_8$ nanowire along the [10$\bar{1}$0] zone axis.

Additionally, spherical aberration-corrected high-angle annular dark-field scanning TEM (HAADF-STEM) was employed to image the atomic structure of the prepared $K_xV_6S_8$ nanowire. In FIGS. 8A-8B, the STEM images taken along the [1$\bar{1}$00] zone axis revealed the typical atomic arrangement of the hexagonal phase structure, consistent with the simulated STEM image shown in FIG. 8C.

Figure 9A:
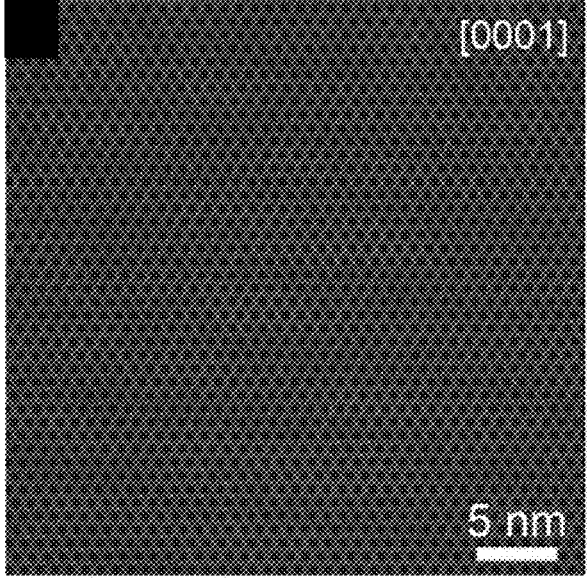
FIG. 9A and FIG. 9B show cross-sectional HAADF-STEM images of a $K_xV_6S_8$ nanowire along the c-axis. The white arrows in FIG. 9B shows the existence of potassium ions in some hexagonal channels.
Figure 9B:
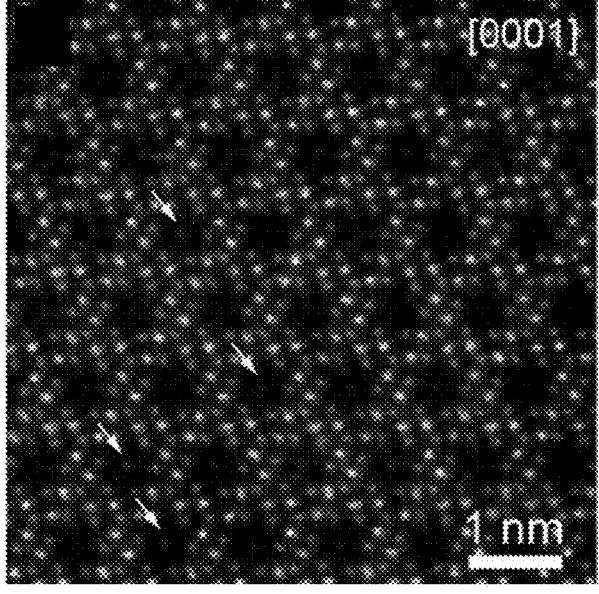
Figure 9C:
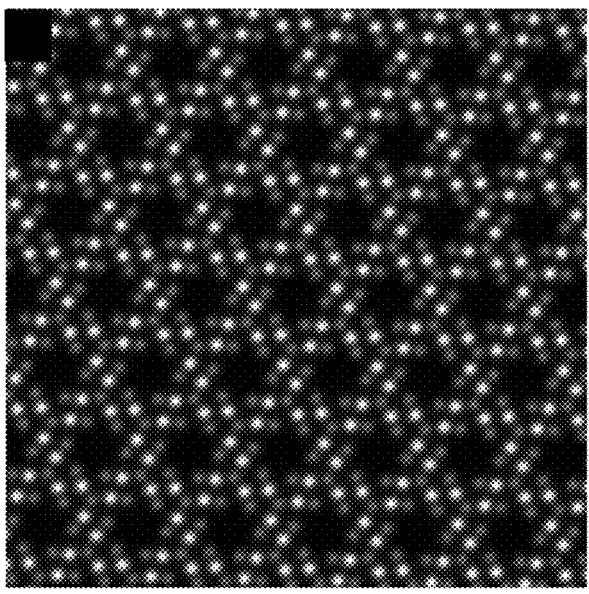
FIG. 9C shows a simulated cross-sectional STEM image of the hexagonal-phase $K_xV_6S_8$ structure along the c-axis.
Figure 9D:
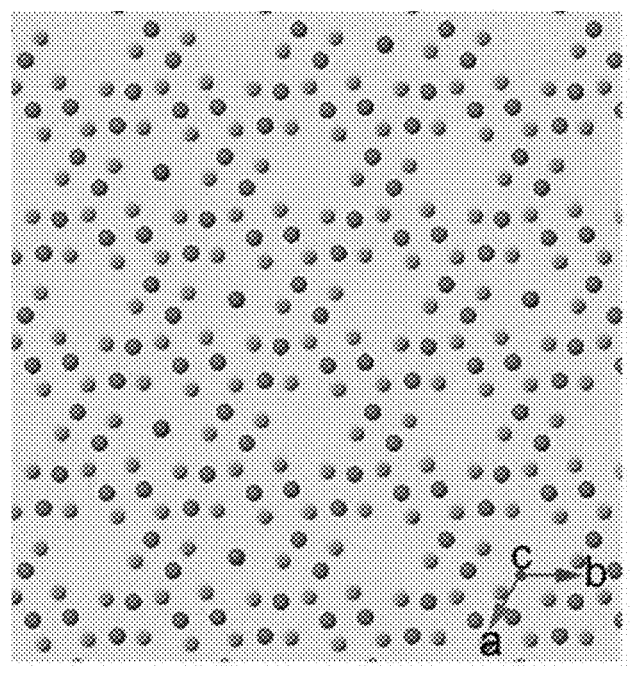
FIG. 9D depicts an atomic structure model of hexagonal-phase $K_xV_6S_8$ structure along the c-axis.
Figure 10A:
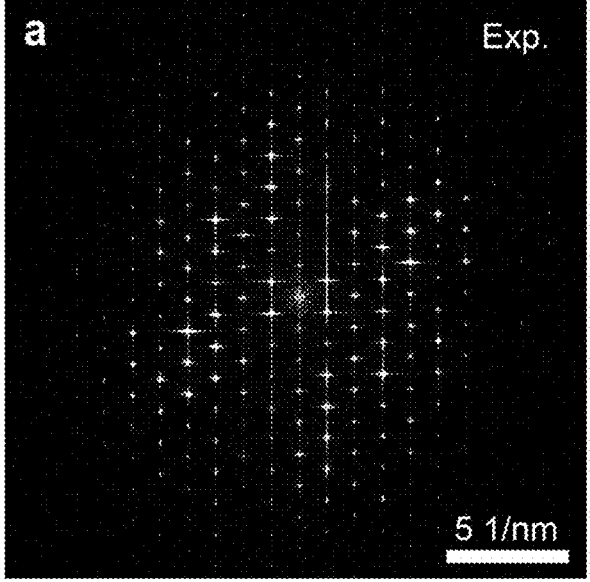
FIG. 10A shows a corresponding fast Fourier transform (FFT) pattern taken from the cross-sectional HAADF-STEM image in FIG. 9A.
Figure 10B:
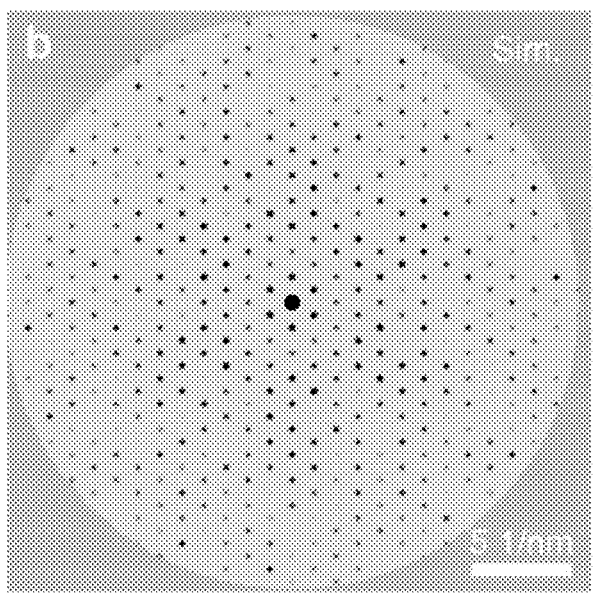
FIG. 10B shows a simulated SAED pattern of the hexagonal-phase $K_xV_6S_8$ structure along the c-axis.

To further elucidate the crystal structure of the 1D $K_xV_6S_8$ nanowires, focused ion beam (FIB) technique was carried out to cut a $K_xV_6S_8$ nanowire along the crystal plane perpendicular to the [0001] zone axis. In FIGS. 9A-9B, the cross-sectional HAADF-STEM images clearly revealed the nanowire, comprised of numerous regularly arranged hexagonal channels, growing along the c-axis. The enlarged cross-sectional HAADF-STEM image was shown in FIG. 9B. The result showed that the potassium ions (indicated by white arrows in FIG. 9B) were accommodated within the center of some channels to form columns, surrounded by six sulfur atoms in a trigonally distorted octahedron. These results were consistent with the simulated cross-sectional STEM image (FIG. 9C) and atomic structure model (FIG. 9D) along the [0001] zone axis. In addition, the corresponding FFT pattern (FIG. 10A) of the cross-sectional STEM image (FIG. 9A) was also consistent with the simulated SAED pattern (FIG. 10B), further demonstrating the successful synthesis of hexagonal-phase $K_xV_6S_8$ nanowires.

Figure 11:
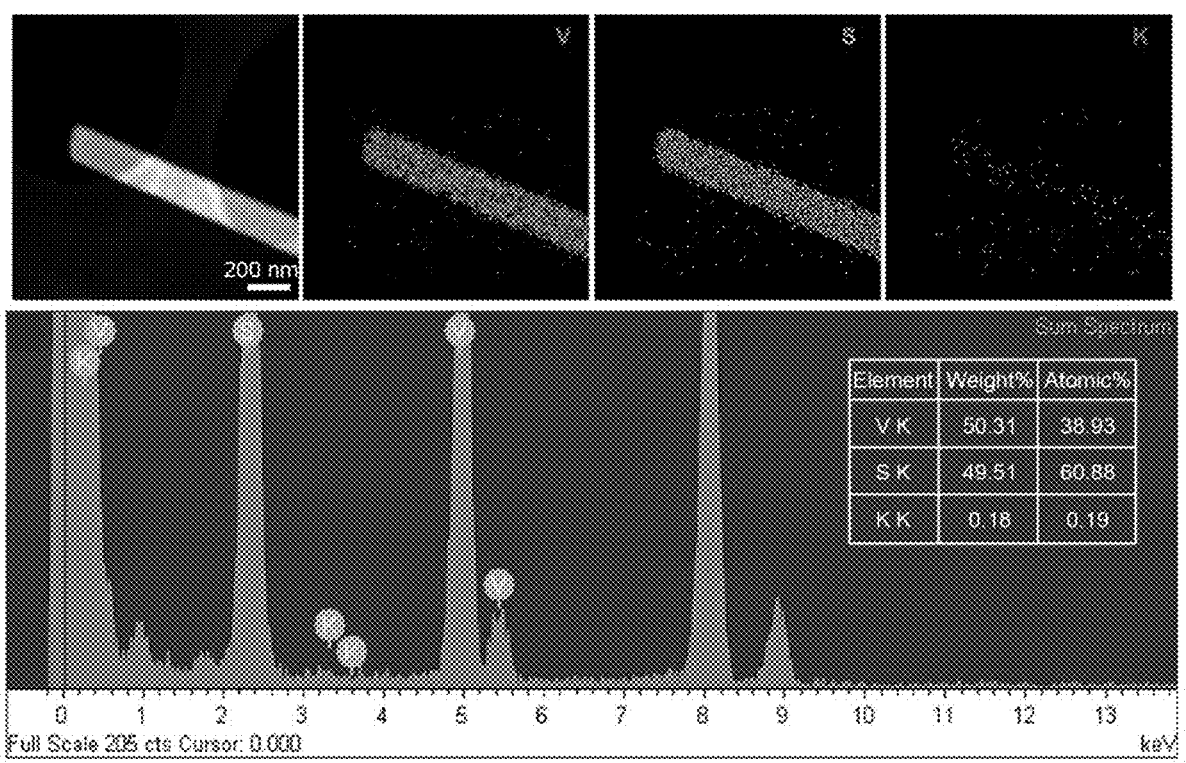
FIG. 11 shows a dark-field STEM image of the as-prepared $K_xV_6S_8$ nanowire, and the corresponding elemental mapping images of the $K_xV_6S_8$ nanowire. EDS characterization of a hexagonal-phase $K_xV_6S_8$ nanowire under STEM mode is also shown. The extra element signals originate from the Cu TEM grid. Inset: corresponding weight and atomic ratios of V, S, and K elements obtained from the EDS spectrum.

Furthermore, elemental mapping and energy-dispersive X-ray spectroscopy (EDS) spectra, obtained under STEM mode, confirmed the even dispersion of strong V and S signals, along with very weak K signals, with an atomic ratio of approximately 0.2% throughout the $K_xV_6S_8$ nanowire (FIG. 11).

Figure 12A:
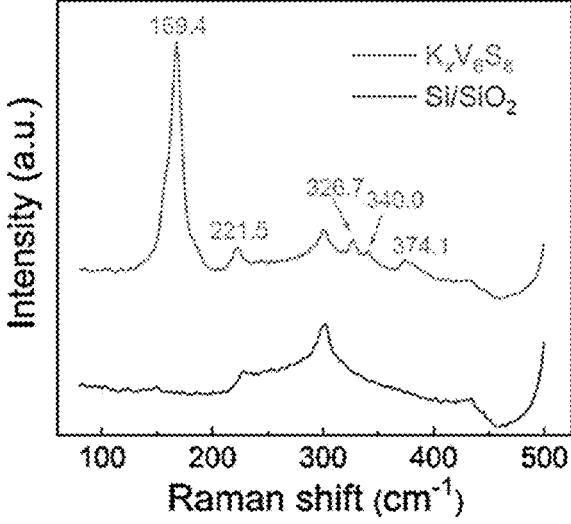
FIG. 12A depicts Raman spectra of the as-prepared hexagonal-phase $K_xV_6S_8$ nanowire (gray curve) and bare Si/SiO$_2$ substrate (black curve).
Figure 12B:
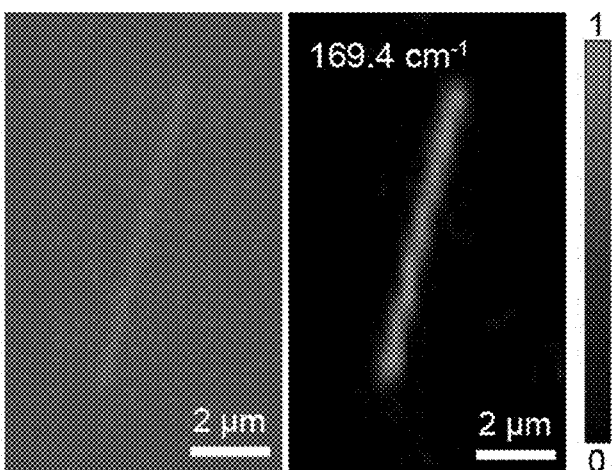
FIG. 12B shows an optical image (left) and Raman mapping image (right) of a single $K_xV_6S_8$ nanowire.

Referring to FIG. 12A, the Raman spectrum (recorded at 532 nm) of the $K_xV_6S_8$ nanowire displayed five distinctive Raman peaks located at 169.4, 221.5, 326.7, 340.0, and 374.1 cm$^{-1}$, respectively, which are different from those in previously reported vanadium sulfides[17-19]. The Raman mapping image (FIG. 12B) of a single $K_xV_6S_8$ nanowire exhibited uniform Raman signals, indicating its uniform chemical composition and crystal structure, as well as the high quality of the as-prepared 1D $K_xV_6S_8$ nanowires.

Figure 12C:
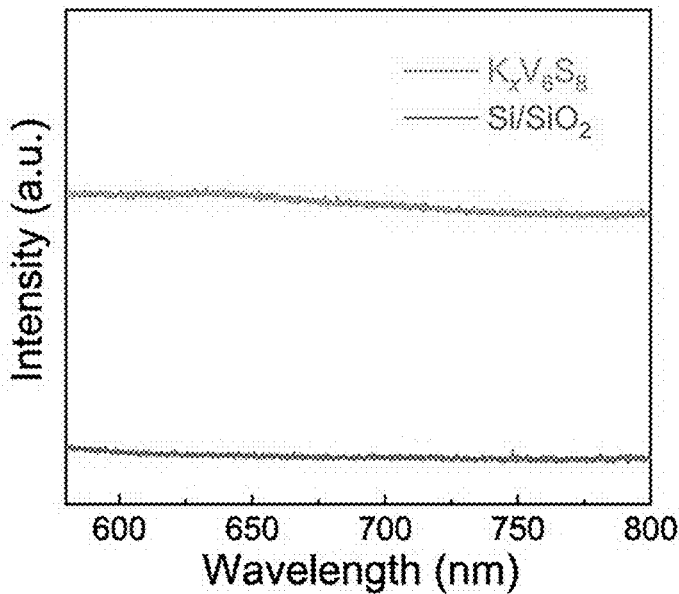
FIG. 12C depicts PL spectra of the as-prepared hexagonal-phase $K_xV_6S_8$ nanowire (gray curve) and bare Si/SiO$_2$ substrate (black curve)

Furthermore, the photoluminescence (PL) spectra of the synthesized $K_xV_6S_8$ nanowire and the bare Si/SiO$_2$ substrate were depicted in FIG. 12C. The photoluminescence PL spectra exhibited the PL quenching phenomenon without obvious absorption peaks, indicating the metallic property of 1D $K_xV_6S_8$ nanowires.

Figure 13:
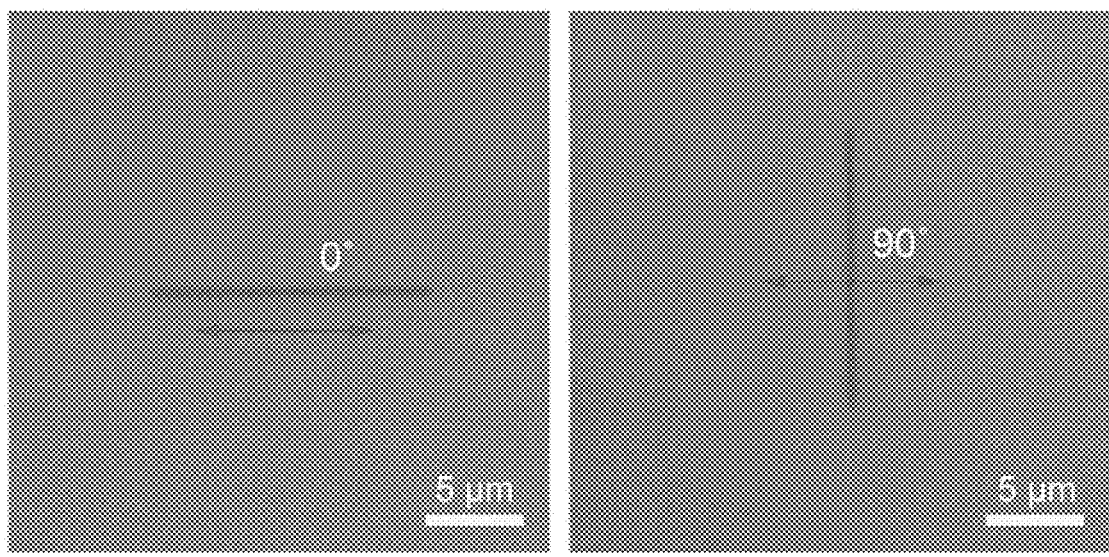
FIG. 13 shows 0° and 90° between the incident laser polarization (arrow) and the c-axis of the synthesized $K_xV_6S_8$ nanowire.
Figure 14A:
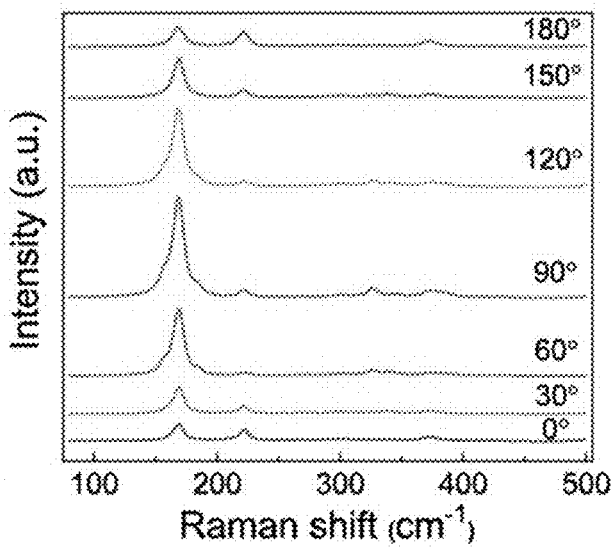
FIG. 14A depicts angle-resolved polarized Raman spectra of the synthesized $K_xV_6S_8$ nanowire measured under 532 nm laser with polarization angle changing from 0° to 180°.
Figure 14B:
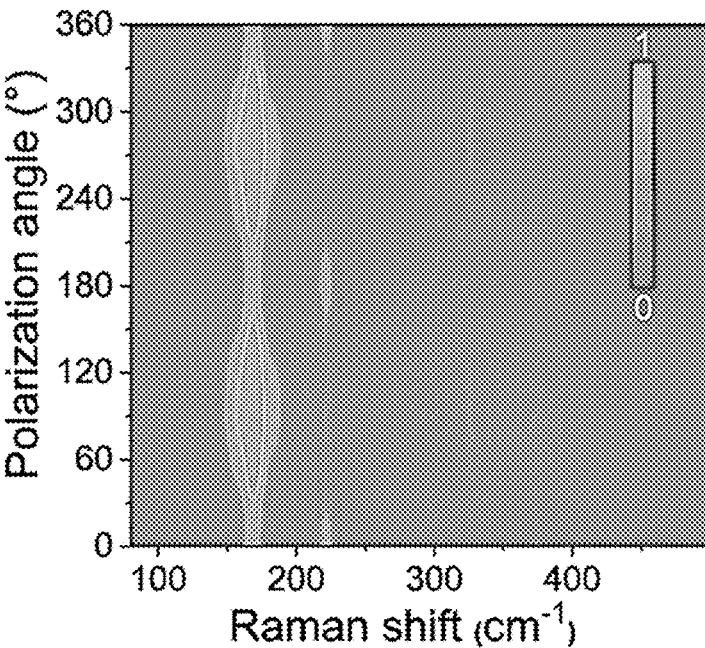
FIG. 14B depicts the corresponding hot spot map of Raman spectra under different polarization angles ranging from 0° to 360°.

Moreover, angle-resolved polarized Raman spectroscopy (ARPRS) was conducted to investigate the anisotropic phonon vibration and crystal orientation of the as-prepared $K_xV_6S_8$ nanowire[20-21]. During the test process, 0° and 90° indicated that the laser's polarization aligned parallel and perpendicular to the c-axis of the synthesized $K_xV_6S_8$ nanowire, respectively (FIG. 13). The polarized Raman spectra from 0° to 180° and the corresponding hot spot map were displayed in FIGS. 14A-14B, revealing that the peak intensity of all five Raman modes exhibited periodic variations when parallel polarization configurations were applied. This observation indicated the structural anisotropy of the as-prepared $K_xV_6S_8$ nanowire.

Figure 15:
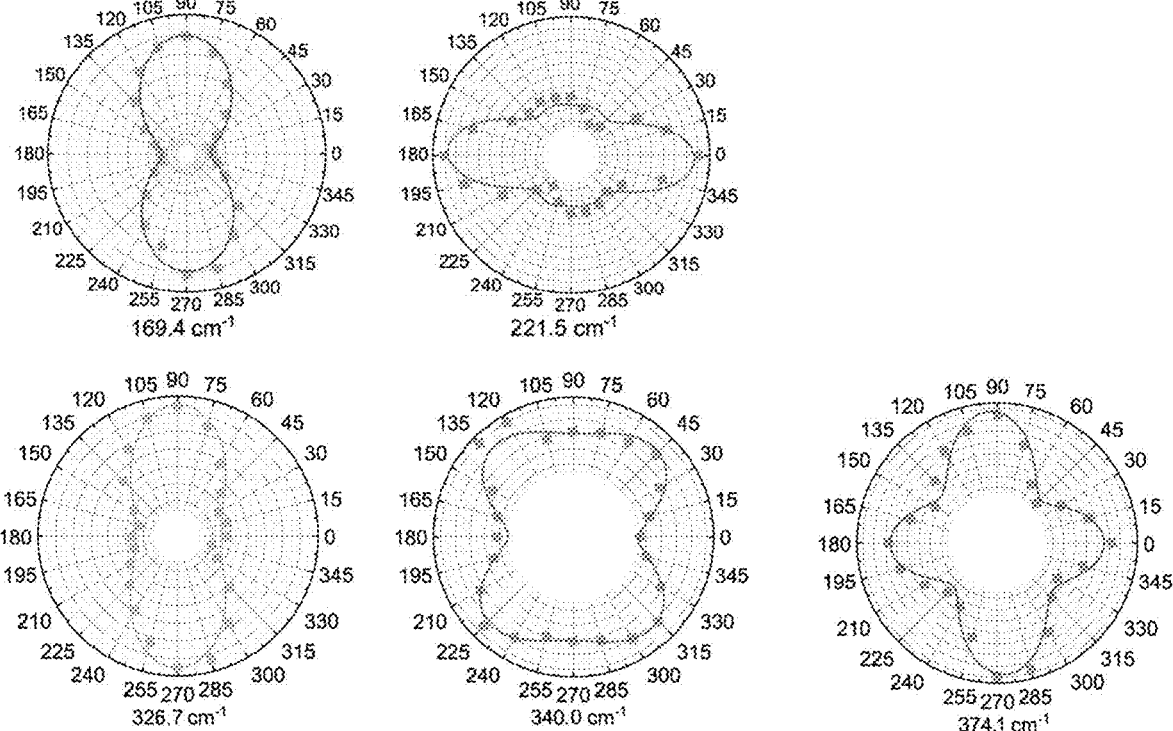
FIG. 15 depicts polar coordination charts of the Raman peak intensity as a function of polarization angle.

To further investigate the correlation between the Raman peaks and polarization angle, polar coordinate charts for all five Raman modes (Raman peaks located at 169.4, 221.5, 326.7, 340.0, and 374.1 cm$^{-1}$) were also depicted in FIG. 15. The intensities of the Raman peaks at 221.5, 340.0, and 374.1 cm$^{-1}$ displayed four angles of maximum intensity. In contrast, the intensities of the Raman modes at 169.4 and 326.7 cm$^{-1}$ exhibited a 180° period, with minimum Raman intensities at polarization angles of 0° and 180°. This observation aligns well with the c-axis of the synthesized $K_xV_6S_8$ nanowire, allowing it to be used for determining its crystalline orientation.

Figure 16:
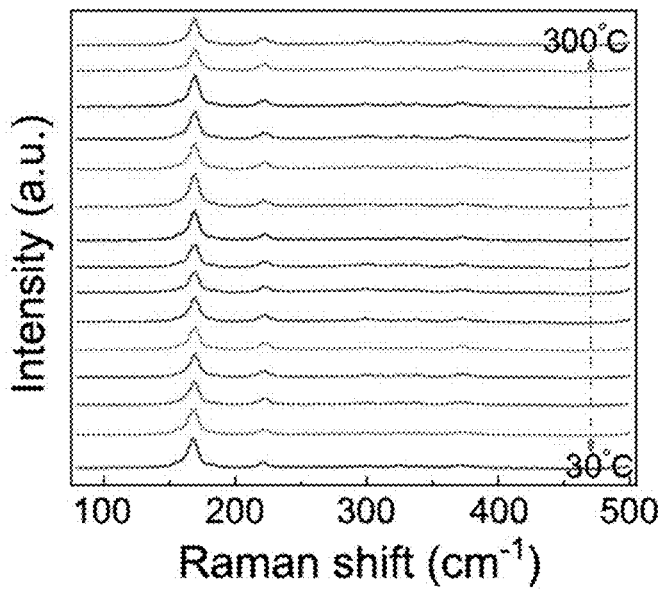
FIG. 16 depicts Raman spectra of the as-prepared $K_xV_6S_8$ nanowire under different heating temperatures ranging from 30 to 300° C.

Furthermore, temperature-dependent Raman spectra was performed to reveal the thermal stability of the synthesized hexagonal-phase $K_xV_6S_8$ nanowire. As shown in FIG. 16, the Raman spectra remained unchanged in the temperature range of 30 to 300° C., indicating its remarkable stability at elevated temperatures. Such exceptional thermal stability offered significant advantages in various applications, particularly in device fabrication for exploring the electrical properties of the as-grown $K_xV_6S_8$ nanowires.

Figure 17A:
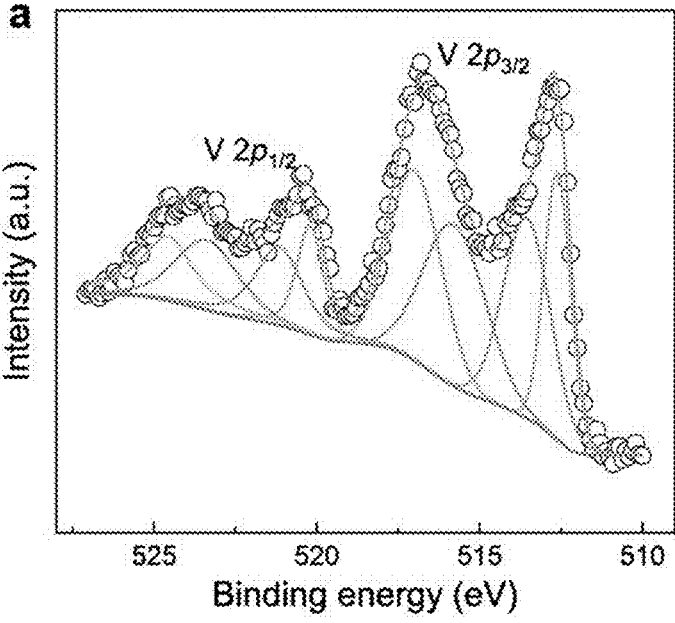
FIG. 17A depicts XPS spectra of V 2p in the as-grown $K_xV_6S_8$ nanowires.
Figure 17B:
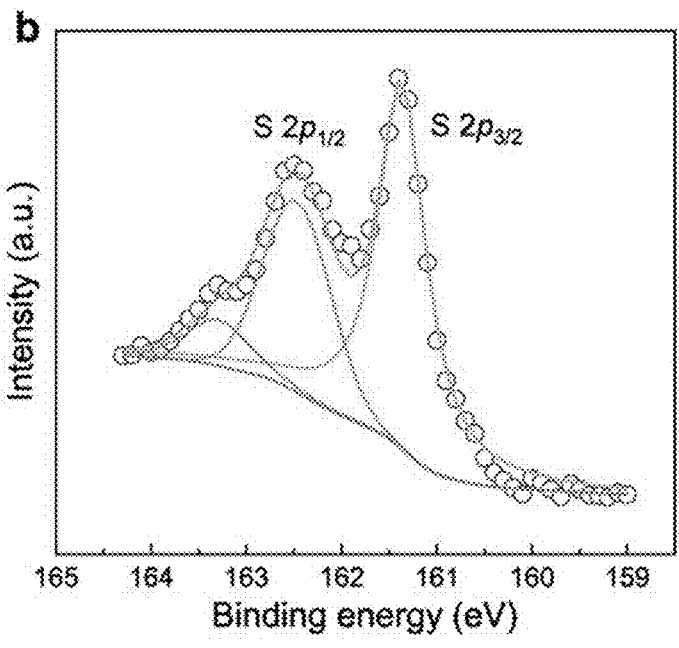
FIG. 17B depicts XPS spectra of S 2p in the $K_xV_6S_8$ nanowires.
Figure 17C:
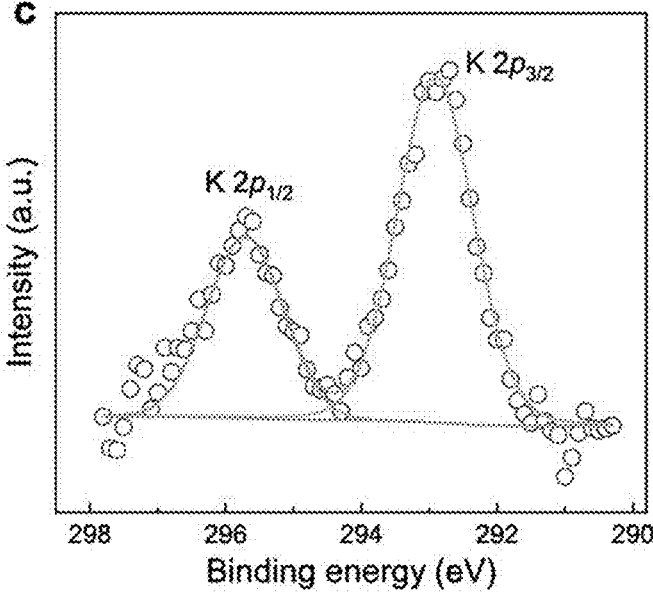
FIG. 17C depicts XPS spectra of K 2p in the $K_xV_6S_8$ nanowires.

Furthermore, X-ray photoelectron spectroscopy (XPS) measurements were conducted on the as-prepared $K_xV_6S_8$ nanowires to investigate the electronic states of the elements (FIGS. 17A-17C). In FIG. 17A, as shown in the V 2p spectra, both V$^{2+}$ and V$^{3+}$ coexisted in the $K_xV_6S_8$ nanowires, demonstrating the formation of V-S bonds. The V 2p$_{1/2}$ and V 2p$_{3/2}$ located at 520.2 and 512.6 eV corresponded to the unreacted V element while the V 2p$_{1/2}$ and V 2p$_{3/2}$ located at 524.6 and 517.0 eV were attributed to the oxidization of the as-grown $K_xV_6S_8$ nanowires. In FIG. 17B, as shown in the S 2p spectra, the peaks located at 161.4 and 162.5 eV were the S 2p$_{3/2}$ and S 2p$_{1/2}$ while the peak located at high binding energy was induced by the oxidized nanowires, which was consistent with the XPS spectra of V. In FIG. 17C, as shown in the K 2p spectra, the K 2p$_{1/2}$ and K 2p$_{3/2}$ located at 295.7 and 292.9 eV confirmed the presence of potassium ions in the as-prepared $K_xV_6S_8$ nanowires. The above XPS results agreed well with the previous reports on vanadium sulfides[11,17,22].

Example 4—Synthesis of Hexagonal-Phase $K_xV_6S_yS_{8-y}$ Nanowires 1 mmol of V$_2$S$_3$ powders, 1.5 mmol of KHCO$_3$ powders, 10 mmol of S powders, and 1 or 2 mmol of Se powders were blended uniformly and then ground for at least 20 minutes utilizing an agate mortar. 20 mg of the obtained mixed powder was transferred to a quartz boat and then two pieces of fresh-cleaved fluorophlogopite mica substrates were precisely covered on the top of the loaded mixture. Then, the quartz boat was transferred to the center of a quartz tube (1 inch in diameter). Before heating, the tube was purged with 500 s.c.c.m for 20 minutes to remove the air and moisture inside it, and then with 80 s.c.c.m Ar and 20 s.c.c.m H$_2$ for 20 minutes to provide an optimal synthesis atmosphere. Subsequently, the tube was inserted into the tube furnace that had been heated to 850° C. and maintained for 6 minutes. After that, the tube furnace was removed from the reaction zone and switched off and the boat was cooled down to room temperature naturally. Finally, the 1D $K_xV_6S_ySe_{8-y}$ nanowires were synthesized on the mica substrate. It is worth noting that the 1D hexagonal-phase $K_xV_6S_ySe_{8-y}$ nanowires could also be synthesized by replacing KHCO$_3$ with other metal salts such as K$_2$S, KCl, K$_2$CO$_3$, and K$_2$C$_2$O$_4$·H$_2$O while keeping the other growth parameters constant.

Example 5—Characterization of Hexagonal-Phase $K_xV_6S_ySe_{8-y}$ Nanowires

By adding 1 or 2 mmol of Se powders to the reaction mixture, 1D hexagonal-phase $K_xV_6S_ySe_{8-y}$ nanowires with different chemical compositions (sulfur-to-selenium ratios) could be easily synthesized.

Figure 18A:
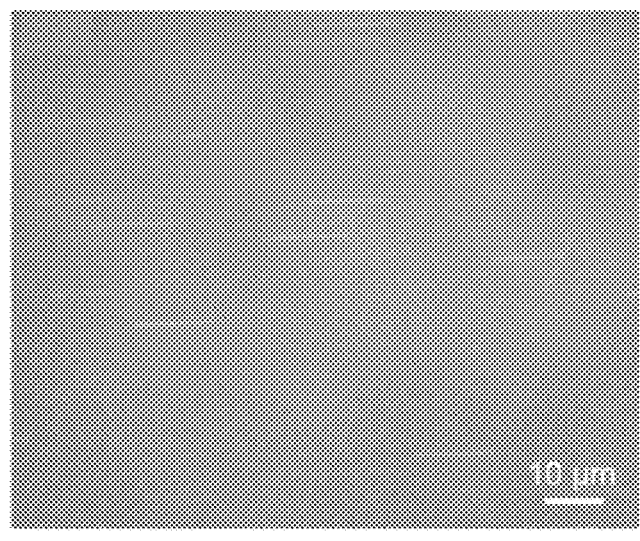
FIG. 18A shows an optical image of the as-prepared $K_xV_6S_ySe_{8-y}$ nanowires on the mica substrate by adding 1 mmol of selenium powders to the reaction mixture.
Figure 18B:
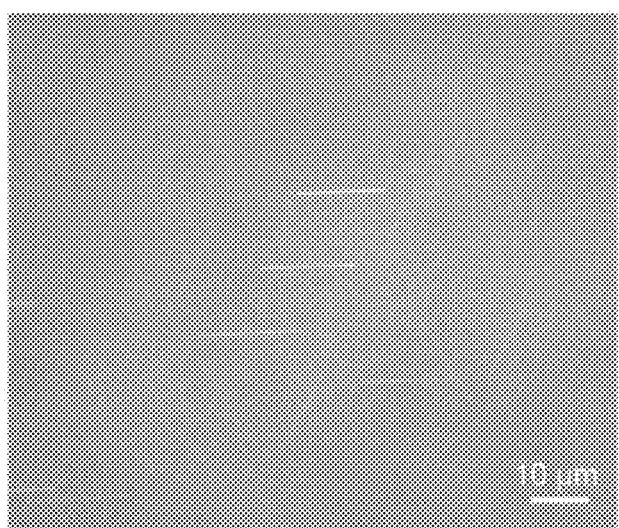
FIG. 18B shows an optical image of the as-prepared $K_xV_6S_ySe_{8-y}$ nanowires on the mica substrate by adding 2 mmol of selenium powders to the reaction mixture.
Figure 19A:
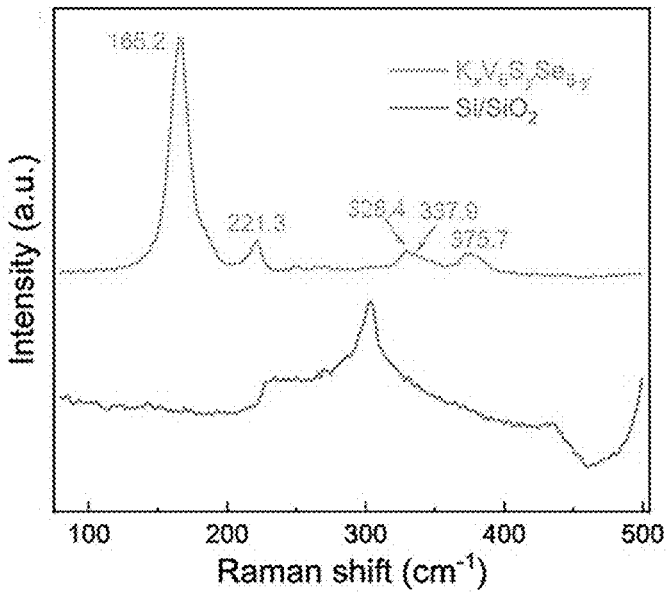
FIG. 19A and FIG. 19B depict Raman spectra of the synthesized hexagonal-phase $K_xV_6S_ySe_{8-y}$ nanowire (gray curve) and bare $Si/SiO_2$ substrate (black curve)
Figure 19B:
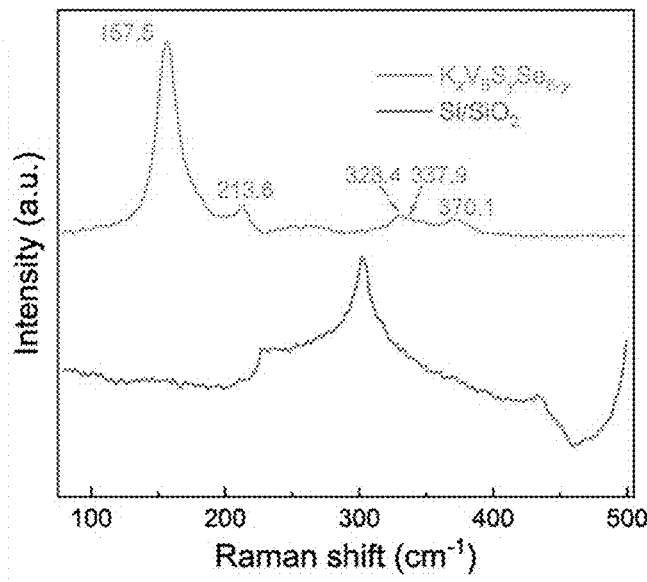
Figure 20A:
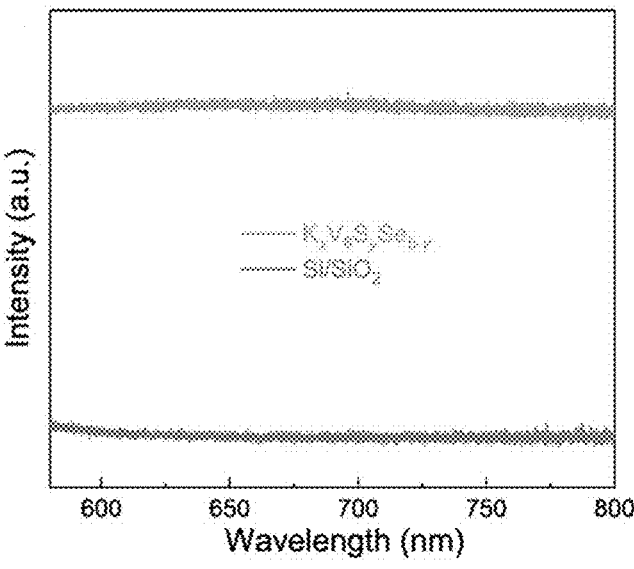
FIG. 20A and FIG. 20B depict PL spectra of the synthesized hexagonal-phase $K_xV_6S_ySe_{8-y}$ nanowire (black curve) and bare $Si/SiO_2$ substrate (grey curve)
Figure 20B:
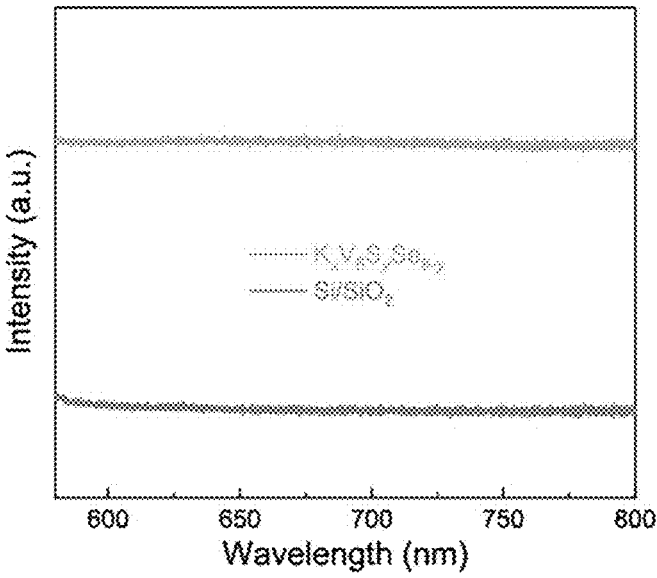
Figure 21A:
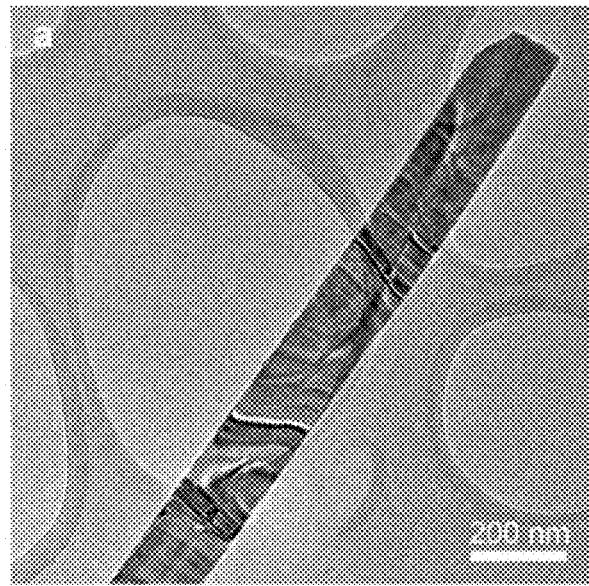
FIG. 21A and FIG. 21B show low-magnification and high-resolution TEM images of a typical hexagonal-phase $K_xV_6S_ySe_{8-y}$ nanowire synthesized by adding 2 mmol of selenium powders to the reaction mixture.
Figure 21B:
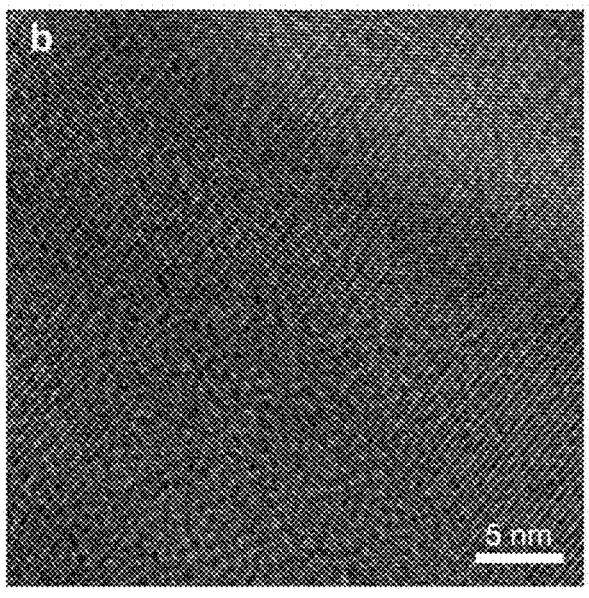
Figure 21C:
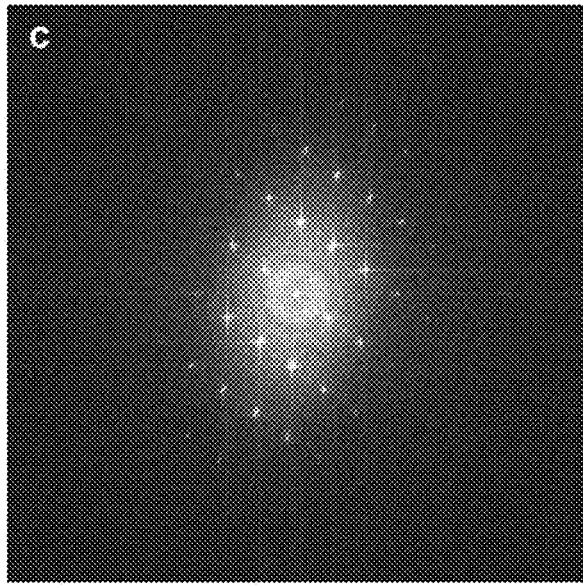
FIG. 21C shows the corresponding FFT pattern taken from the HRTEM image in FIG. 21B.
Figure 21D:
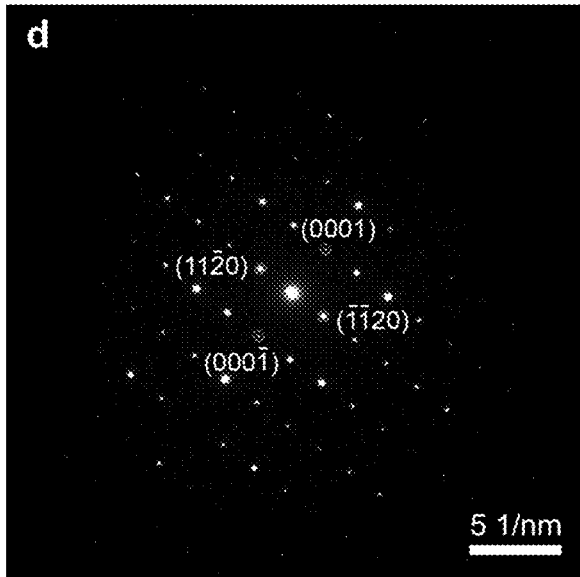
FIG. 21D shows SAED pattern of a typical $K_xV_6S_ySe_{8-y}$ nanowire.
Figure 22:
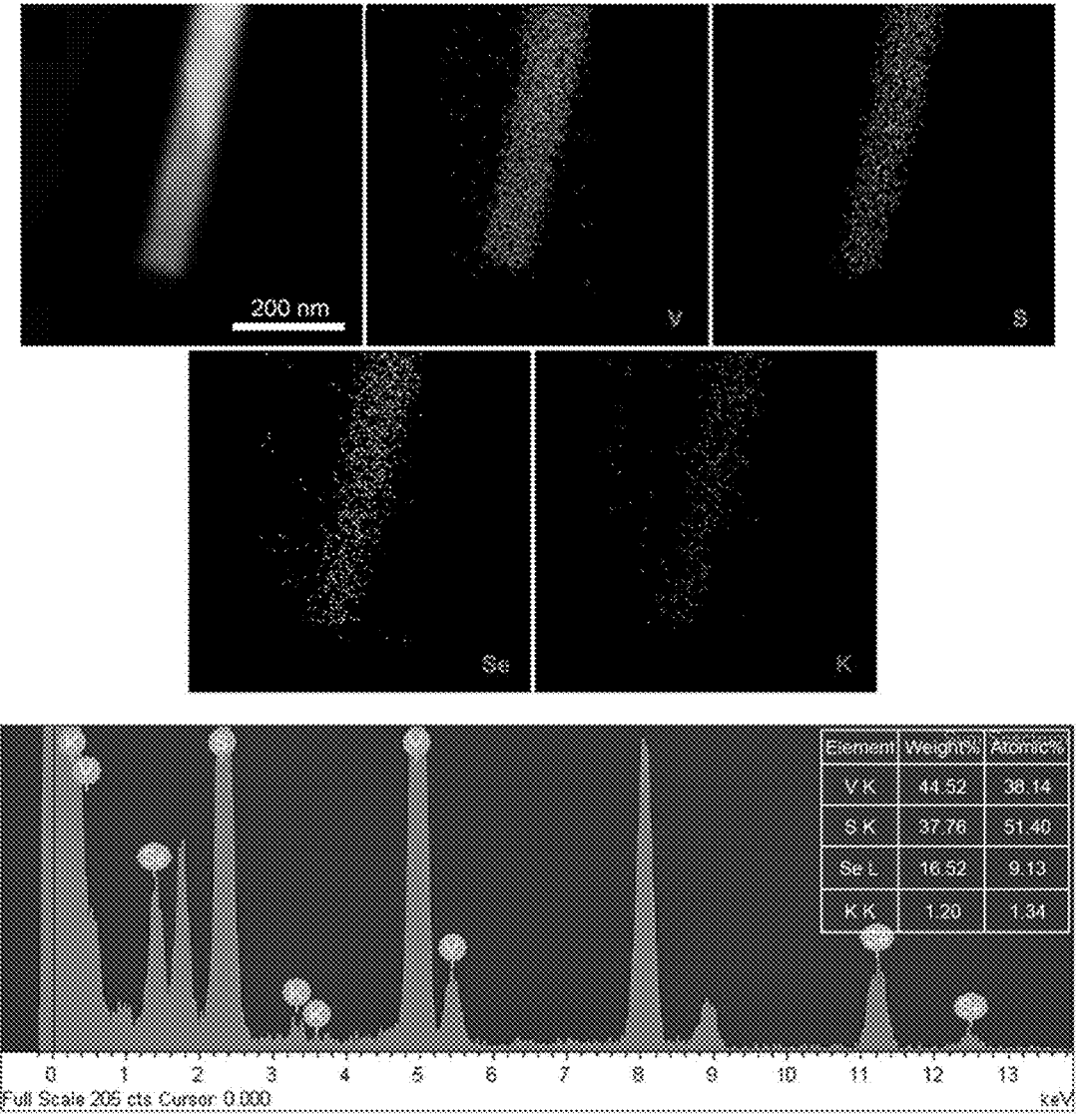
FIG. 22 depicts a dark-field STEM image of the as-prepared $K_xV_6S_ySe_{8-y}$ nanowire, and the corresponding elemental mapping images of the $K_xV_6S_ySe_{8-y}$ nanowire. EDS characterization of a hexagonal-phase $K_xV_6S_ySe_{8-y}$ nanowire under STEM mode is also shown. The extra element signals originate from the Cu TEM grid. Inset: corresponding weight and atomic ratios of V, S, Se and K elements obtained from the EDS spectrum.

As shown in FIGS. 18A-18B, two as-grown hexagonal-phase $K_xV_6S_ySe_{8-y}$ alloys presented a 1D nanowire morphology with lengths of tens of micrometers, similar to the $K_xV_6S_8$ nanowires (FIGS. 3A-3B). The Raman spectra of the synthesized $K_xV_6S_ySe_{8-y}$ nanowires shown in FIG. 19A-19B and the PL spectra of the synthesized $K_xV_6S_ySe_{8-y}$ nanowires shown in FIGS. 20A-20B also exhibited similar Raman peaks and PL quenching phenomena, indicating their metallic nature. The crystal structure of the $K_xV_6S_ySe_{8-y}$ nanowire was further characterized by HRTEM and SAED (FIG. 21A-21D), demonstrating good crystallinity and hexagonal phase structure. Furthermore, the elemental mapping images and EDS characterizations of the $K_xV_6S_ySe_{8-y}$ nanowires showed the even distribution of V, S, Se, and K signals throughout the entire nanowire (FIG. 22).

More impressively, in addition to KHCO$_3$, it was observed that several other metal salts, such as KCl, K$_2$S, K$_2$CO$_3$, K$_2$C$_2$O$_4$·H2O (for synthesizing $K_xV_6S_8$ nanowires), Rb$_2$CO$_3$ (for synthesizing Rb$_xV_6S_8$ nanowires), and Cs$_2$CO$_3$ (for synthesizing Cs$_xV_6S_8$ nanowires), could also be utilized to synthesize the 1D hexagonal-phase M$_xV_6S_8$ nanowires. This indicated the generality of the salt-assisted CVD method. Such method could adjust the types of atoms in the hexagonal channels, offering the opportunity to tune the electronic configuration of the structure and manipulate its physicochemical properties.

Figure 23A:
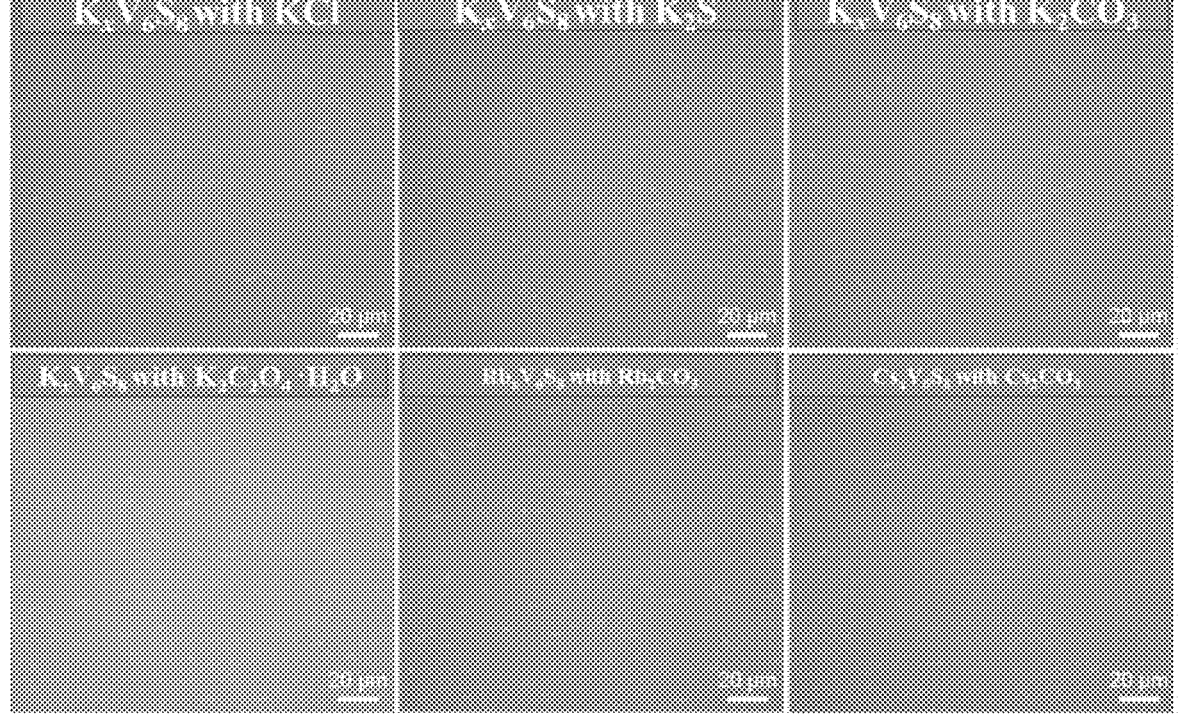
FIGS. 23A-23C depict optical images of the hexagonal-phase $K_xV_6S_8$ nanowires, $Rb_xV_6S_8$ nanowires and $Cs_xV_6S_8$ nanowires synthesized with the assistance of different metal salts.
Figure 23B:
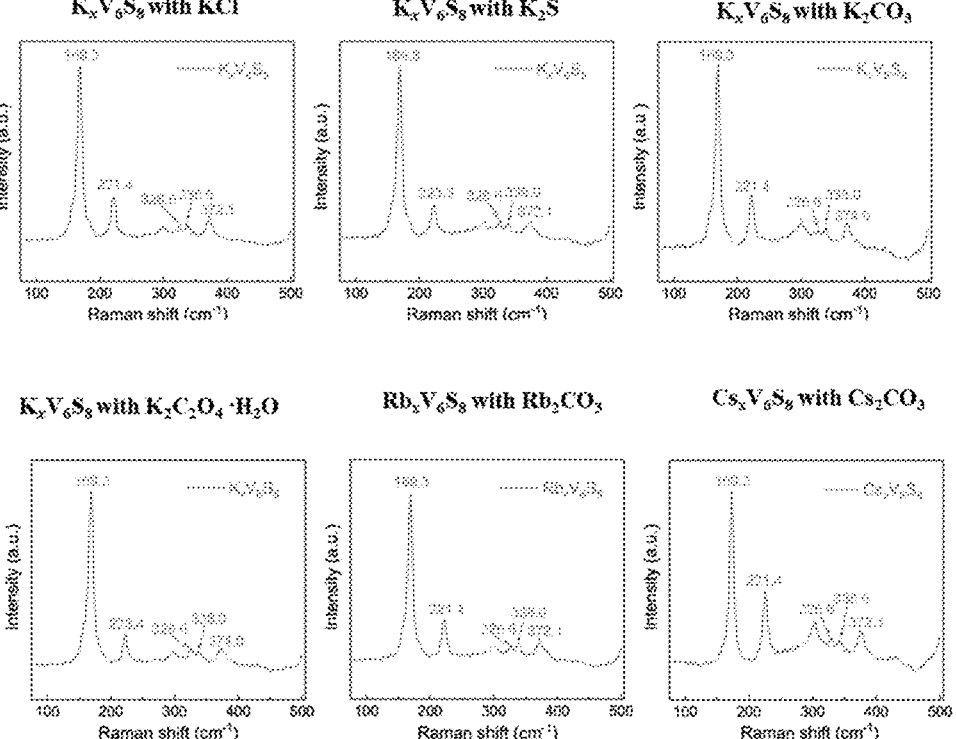
Figure 23C:
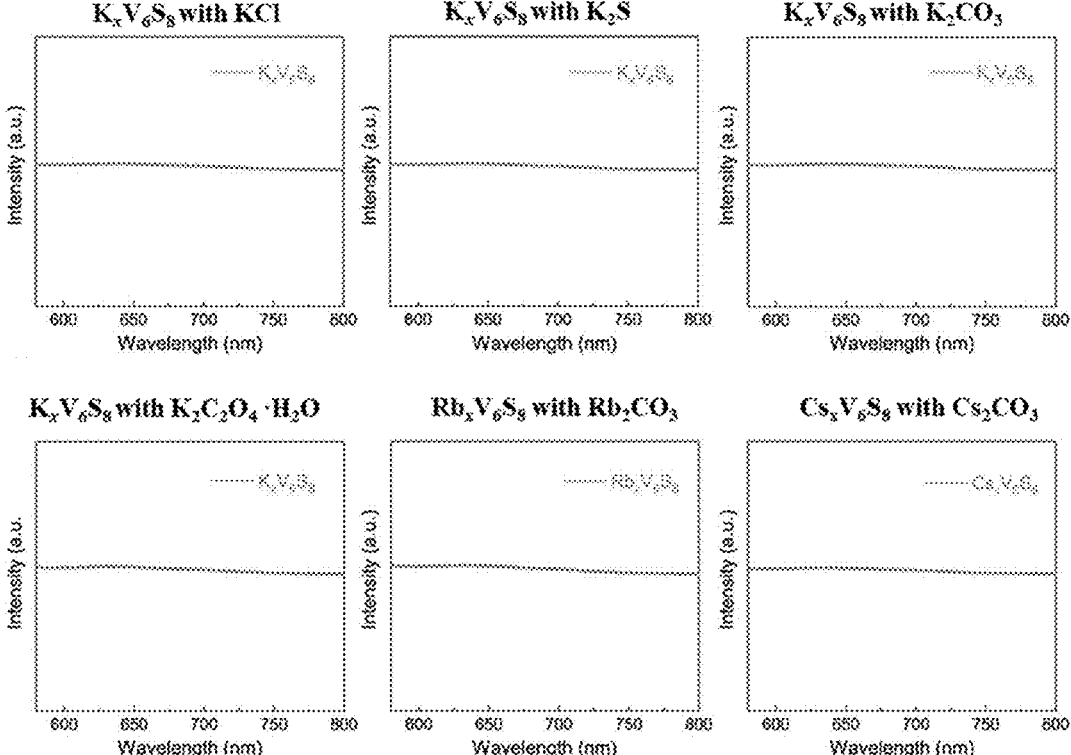

Referring to FIG. 23A, with the assistance of different metal salts, the as-prepared M$_xV_6S_8$ crystals all exhibited 1D nanowire morphology, unique characteristic Raman spectra (FIG. 23B), and complete PL quenching phenomena (FIG. 23C), which agreed well with the $K_xV_6S_8$ nanowires synthesized with the assistance of $KHCO_3$. Moreover, the as-grown $Rb_xV_6S_8$ and $Cs_xV_6S_8$ nanowires had also been characterized by HRTEM, SAED, elemental mapping, and EDS, clearly showing their hexagonal phase structure and uniformly distributed elemental signals in the nanowires.

EXAMPLE 6-Transfer of Hexagonal-Phase $M_xV_6S_8$ and $K_xV_6S_ySe_{8-y}$ Nanowires The as-grown nanowires were transferred based on a previously reported poly(methyl methacrylate) (PMMA)-assisted method with slight modifications. First, the fluorophlogopite mica substrate with the as-prepared hexagonal-phase nanowires was spin-coated with PMMA (PMMA 495, A8, Microchem) at 3000 revolutions per minute (r.p.m.) for 50 s, followed by baking at 75° C. for 18 min. After removing the edge of the mica substrate, nanowires coated with PMMA were easily peeled off from the substrate by using deionized water. Subsequently, the floating PMMA film with nanowires was transferred onto a clean $Si/SiO_2$ substrate, followed by heating at 90° C. for 30 min to increase the adhesion between the PMMA film and the $Si/SiO_2$ substrate. After that, PMMA was eliminated by immersing the $Si/SiO_2$ substrate in acetone for 10 hours. Finally, the $Si/SiO_2$ substrate was dried using nitrogen gas, and the synthesized hexagonal-phase nanowires were left on the $Si/SiO_2$ substrate.

Example 7—Device Fabrication and Measurement

For the fabrication of the three-terminal device based on a single $K_xV_6S_8$ nanowire, at first, the transfer of 1D $K_xV_6S_8$ nanowires was performed according to the PMMA-assisted wet transfer method. After the 1D $K_xV_6S_8$ nanowires were transferred from mica to the Si/50 nm $SiO_2$ substrate, drain and source electrodes were fabricated on the nanowire by the standard electron-beam lithography processing. Then 8 nm of Cr and 70 nm of Au were thermally evaporated as electrodes and followed by a lift-off process.

For the fabrication of $MoS_2$-based field effect transistors based on asymmetrical electrode contacts consisting of the nanowire contact on one side and the Cr/Au contact on the other side, at first, monolayer $MoS_2$ was grown at 850° C. for 30 min onto Si/300 nm $SiO_2$ substrates by the oxygen-assisted CVD method with the 500/1 s.c.c.m $Ar/O_2$ mixed flow. The transfer of 1D $K_xV_6S_8$ nanowires was performed according to the PMMA-assisted wet transfer method. After the 1D $K_xV_6S_8$ nanowires were transferred from mica to the sacrificial Si/50 nm $SiO_2$ substrate, the polypropylene carbonate (PPC) layer was spin coated on the silicon substrate with a speed of 3000 rpm and was baked at 60° C. for 2 min. These nanowires were mechanically peeled (pick-up) in DI water and released (drop-down) to the target substrate by a PPC-coated poly(dimethylsiloxane) (PDMS) block mounted on a glass slide via the mechanical aligner under an optical microscope. Before the PPC removal, the transferred sample covered by the PPC film was baked at 150° C. for >30 min to improve the vdWs coupling strength of metal-semiconductor contacts. Then drain and source electrodes were fabricated on the device by the standard electron-beam lithography processing. And 8 nm of Cr and 70 nm of Au were thermally evaporated as electrodes and followed by a lift-off process.

The electrical properties of these devices were measured in the Probe Station by Keysight B1500A Semiconductor Device Parameter Analyzer.

Example 8—Electrical Properties of 1D $K_xV_6S_8$ Nanowires

Figure 24A:
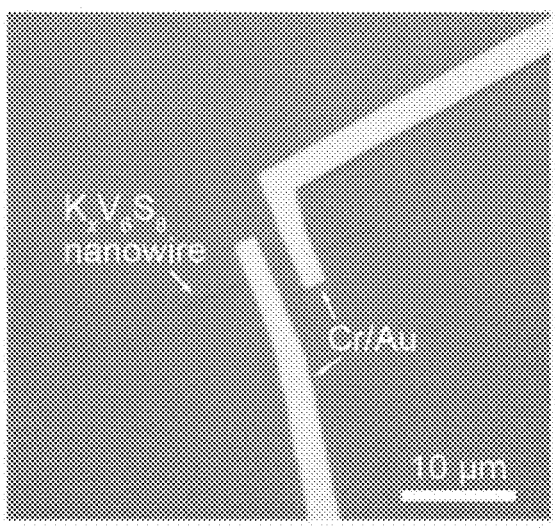
FIG. 24A shows an optical image of the three-terminal device based on a single $K_xV_6S_8$ nanowire.

As shown in FIG. 24A, a three-terminal device based on a single $K_xV_6S_8$ nanowire was fabricated. In the device, Si served as the substrate, a 50 nm $SiO_2$ layer acted as the dielectric, a $K_xV6S8$ nanowire functioned as the semiconducting channel, and Cr/Au were used as the source-drain electrodes and gate electrode, respectively.

Figure 24B:
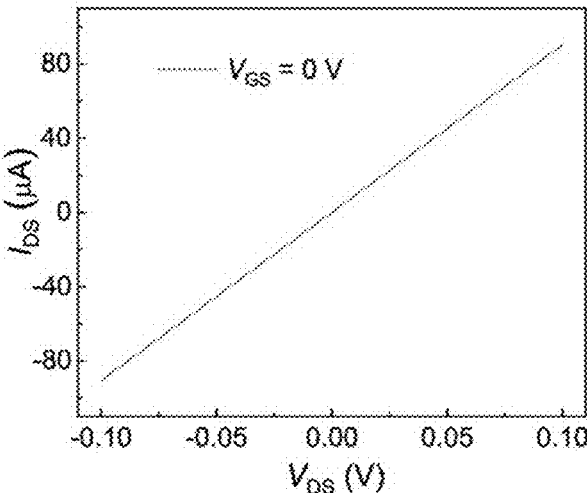
FIG. 24B depicts a typical $V_D S$-$I_D S$ electrical curve without gate bias.
Figure 24C:
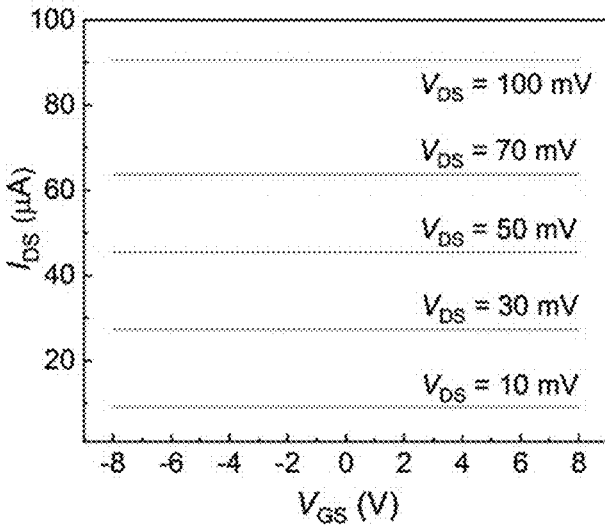
FIG. 24C depicts typical transfer curves of the device under different source-drain biases.

The AFM image of the device revealed that the thickness of the 1D $K_xV_6S_8$ nanowire was approximately 12 nm. The electrical curve without the gate bias (FIG. 24B) displayed a linear $V_{DS}$-$I_{DS}$ relationship and nearly ideal ohmic contact. Besides, the transfer curve of the device (FIG. 24C) exhibited weak gate-tunable conductance without electrical switching behaviors[23]. These results demonstrated the metallic nature of 1D $K_xV_6S_8$ nanowires, which was in agreement with the photoluminescence characterization results.

Figure 24D:
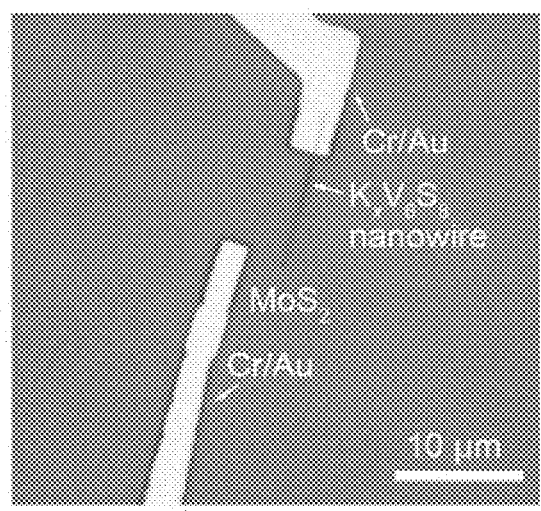
FIG. 24D shows an optical image of the $MoS_2$-based field effect transistors based on asymmetrical electrode contacts consisting of the nanowire contact on one side and the Cr/Au contact on the other side.
Figure 24E:
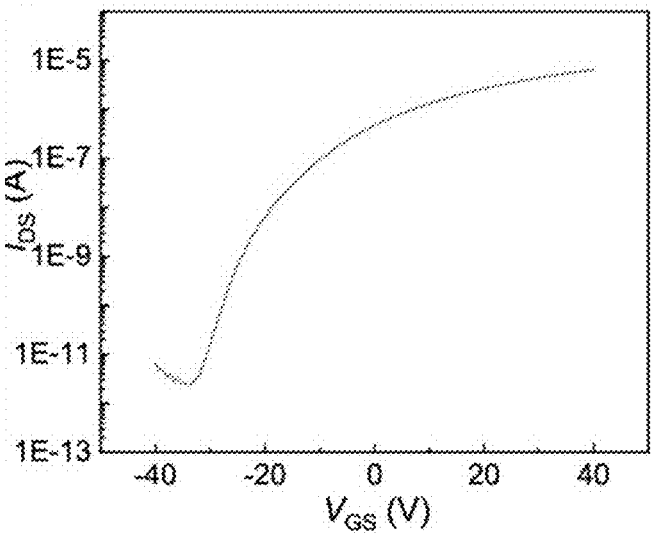
FIG. 24E depicts typical transfer of the $MoS_2$-based field effect transistors.
Figure 24F:
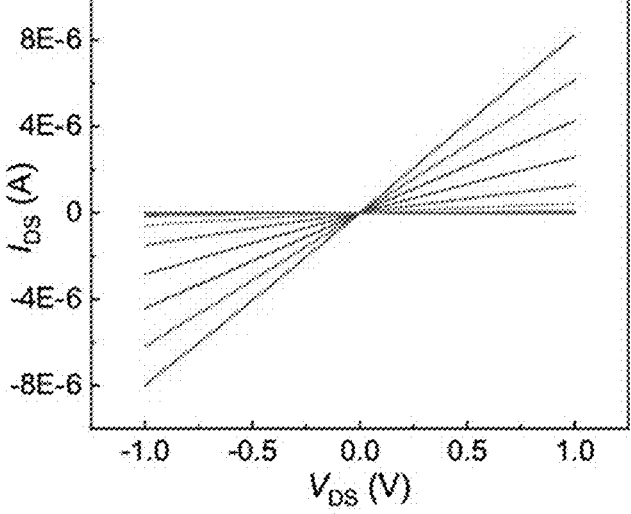
FIG. 24F depicts output curves of the $MoS_2$-based field effect transistors.

Furthermore, $MoS_2$-based field-effect transistors were fabricated using asymmetrical electrode contacts, with the nanowire contact on one side and the Cr/Au contact on the other side, as shown in FIG. 24D. Surprisingly, the devices exhibited good n-type semiconducting behavior with an on/off ratio of $10^6$ (FIG. 24E), and the output curves (FIG. 24F) showed that the Schottky barriers of the contacts on both sides were basically the same, indicating that the synthesized nanowires may be a good van der Waals contact for achieving high-performance fermi level pinning free transistors[24-26].

Definitions

Throughout this specification, unless the context requires otherwise, the word "comprise" or variations such as "comprises" or "comprising", will be understood to imply the inclusion of a stated integer or group of integers but not the exclusion of any other integer or group of integers. It is also noted that in this disclosure and particularly in the claims and/or paragraphs, terms such as "comprises", "comprised", "comprising" and the like can have the meaning attributed to it in U.S. Patent law; e.g., they allow for elements not explicitly recited, but exclude elements that are found in the prior art or that affect a basic or novel characteristic of the present invention.

Furthermore, throughout the specification and claims, unless the context requires otherwise, the word "include" or variations such as "includes" or "including", will be understood to imply the inclusion of a stated integer or group of integers but not the exclusion of any other integer or group of integers.

References in the specification to "one embodiment", "an embodiment", "an example embodiment", etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Other definitions for selected terms used herein may be found within the detailed description of the present invention and apply throughout. Unless otherwise defined, all other technical terms used herein have the same meaning as commonly understood to one of ordinary skill in the art to which the present invention belongs.

It will be appreciated by those skilled in the art, in view of these teachings, that alternative embodiments may be implemented without undue experimentation or deviation from the spirit or scope of the invention, as set forth in the appended claims. This invention is to be limited only by the following claims, which include all such embodiments and modifications when viewed in conjunction with the above specification and accompanying drawings.

INDUSTRIAL APPLICABILITY

The present invention offers a robust and straightforward CVD method for synthesizing highly conductive 1D metallic hexagonal-phase $M_xV_6S_8$ nanowires with high yield. These nanowires are utilized as excellent van der Waals contacts in $MoS_2$-based field-effect transistors, resulting in good ohmic contact, significant charge mobility, and reduced Fermi-level pinning. This synthetic strategy exhibits promising potential for electronic applications. Moreover, CVD-synthesized hexagonal-phase $MxV_6S_8$ structures are promising candidates for superconductivity due to their large channels aligned with the c-axis. These channels can host various ions, allowing for precise electronic structure adjustments and the enhancement of their superconducting properties.

Due to the high conductivity of $M_xV_6S_8$ nanowires, the as-prepared nanowires can also function as electrode materials for supercapacitors and batteries.

REFERENCES: THE DISCLOSURES OF THE FOLLOWING REFERENCES ARE INCORPORATED BY REFERENCE

ADDIN EN.REFLIST
[1] S. Iijima, *Nature* 1991, 354, 56.
[2] R. S. Wagner, W. C. Ellis, *Appl. Phys. Lett.* 2004, 4, 89.
[3] J. Lin, O. Cretu, W. Zhou, K. Suenaga, D. Prasai, K. I. Bolotin, N. T. Cuong, M. Otani, S. Okada, A. R. Lupini, J.-C. Idrobo, D. Caudel, A. Burger, N. J. Ghimire, J. Yan, D. G. Mandrus, S. J. Pennycook, S. T. Pantelides, *Nat. Nanotechnol.* 2014, 9, 436.
[4] H. E. Lim, Y. Nakanishi, Z. Liu, J. Pu, M. Maruyama, T. Endo, C. Ando, H. Shimizu, K. Yanagi, S. Okada, T. Takenobu, Y. Miyata, *Nano Lett.* 2021, 21, 243.
[5] Y. Yoo, J. S. Jeong, R. Ma, S. J. Koester, J. E. Johns, *Chem. Mater.* 2020, 32, 9650.
[6] D. Voiry, H. S. Shin, K. P. Loh, M. Chhowalla, *Nat. Rev. Chem.* 2018, 2, 0105.
[7] L. Venkataraman, C. M. Lieber, *Phys. Rev. Lett.* 1999, 83, 5334.
[8] Y. Chen, Z. Lai, X. Zhang, Z. Fan, Q. He, C. Tan, H. Zhang, *Nat. Rev. Chem.* 2020, 4, 243.
[9] O. Fuentes, H.-H. Wang, B. H. Ward, J. Zhang, D. M. Proserpio, F. Calvagna, C. E. Check, K. C. Lobring, C. Zheng, *Chem. Mater.* 2001, 13, 3051.
[10] K. D. Bronsema, G. A. Wiegers, *Mat. Res. Bull.* 1987, 22, 1073.
[11] W. Bensch, J. Koy, M. Wesemann, *J. Alloys Compd.* 1992, 178, 193.
[12] S. Li, S. Wang, D.-M. Tang, W. Zhao, H. Xu, L. Chu, Y. Bando, D. Golberg, G. Eda, *Appl. Mater. Today* 2015, 1, 60.
[13] J. Zhou, J. Lin, X. Huang, Y. Zhou, Y. Chen, J. Xia, H. Wang, Y. Xie, H. Yu, J. Lei, D. Wu, F. Liu, Q. Fu, Q. Zeng, C.-H. Hsu, C. Yang, L. Lu, T. Yu, Z. Shen, H. Lin, B. I. Yakobson, Q. Liu, K. Suenaga, G. Liu, Z. Liu, *Nature* 2018, 556, 355.
[14] B. Qin, M. Z. Saeed, Q. Li, M. Zhu, Y. Feng, Z. Zhou, J. Fang, M. Hossain, Z. Zhang, Y. Zhou, Y. Huangfu, R. Song, J. Tang, B. Li, J. Liu, D. Wang, K. He, H. Zhang, R. Wu, B. Zhao, J. Li, L. Liao, Z. Wei, B. Li, X. Duan, X. Duan, *Nat. Commun.* 2023, 14, 304.
[15] J. You, J. Pan, S.-L. Shang, X. Xu, Z. Liu, J. Li, H. Liu, T. Kang, M. Xu, S. Li, D. Kong, W. Wang, Z. Gao, X. Zhou, T. Zhai, Z.-K. Liu, J.-K. Kim, Z. Luo, *Nano Lett.* 2022, 22, 10167.
[16] Z. Lai, Y. Yao, S. Li, L. Ma, Q. Zhang, Y. Ge, W. Zhai, B. Chi, B. Chen, L. Li, L. Wang, Z. Zheng, L. Gu, Y. Du, H. Zhang, *Adv. Mater.* 2022, 34, 2201194.
[17] J. Zhou, W. Zhang, Y.-C. Lin, J. Cao, Y. Zhou, W. Jiang, H. Du, B. Tang, J. Shi, B. Jiang, X. Cao, B. Lin, Q. Fu, C. Zhu, W. Guo, Y. Huang, Y. Yao, S. S. P. Parkin, J. Zhou, Y. Gao, Y. Wang, Y. Hou, Y. Yao, K. Suenaga, X. Wu, Z. Liu, *Nature* 2022, 609, 46.
[18] Q. Ji, C. Li, J. Wang, J. Niu, Y. Gong, Z. Zhang, Q. Fang, Y. Zhang, J. Shi, L. Liao, X. Wu, L. Gu, Z. Liu, Y. Zhang, *Nano Lett.* 2017, 17, 4908.
[19] J. Yuan, J. Wu, W. J. Hardy, P. Loya, M. Lou, Y. Yang, S. Najmaei, M. Jiang, F. Qin, K. Keyshar, H. Ji, W. Gao, J. Bao, J. Kono, D. Natelson, P. M. Ajayan, J. Lou, *Adv. Mater.* 2015, 27, 5605.
[20] Y. Li, S. Wang, J. Hong, N. Zhang, X. Wei, T. Zhu, Y. Zhang, Z. Xu, K. Liu, M. Jiang, H. Xu, *Small* 2023, n/a, 2302623.
[21] Y. Lu, W. Yu, Y. Zhang, J. Zhang, C. Chen, Y. Dai, X. Hou, Z. Dong, L. Yang, L. Fang, L. Huang, S. Lin, J. Wang, J. Wang, J. Li, K. Zhang, *Small* 2023, n/a, 2303903.
[22] W. Bensch, J. Abart, E. Amberger, *Solid State Commun.* 1986, 58, 631.
[23] Z. Lai, Q. He, T. H. Tran, D. V. M. Repaka, D.-D. Zhou, Y. Sun, S. Xi, Y. Li, A. Chaturvedi, C. Tan, B. Chen, G.-H. Nam, B. Li, C. Ling, W. Zhai, Z. Shi, D. Hu, V. Sharma, Z. Hu, Y. Chen, Z. Zhang, Y. Yu, X. Renshaw Wang, R. V. Ramanujan, Y. Ma, K. Hippalgaonkar, H. Zhang, *Nat. Mater.* 2021, 20, 1113.
[24] X. Zhang, Z. Kang, L. Gao, B. Liu, H. Yu, Q. Liao, Z. Zhang, Y. Zhang, *Adv. Mater.* 2021, 33, 2104935.
[25] Y. Wang, J. C. Kim, R. J. Wu, J. Martinez, X. Song, J. Yang, F. Zhao, A. Mkhoyan, H. Y. Jeong, M. Chhowalla, *Nature* 2019, 568, 70.
[26] X. Zhang, H. Yu, W. Tang, X. Wei, L. Gao, M. Hong, Q. Liao, Z. Kang, Z. Zhang, Y. Zhang, *Adv. Mater.* 2022, 34, 2109521.

What is claimed is:

1. A thermal stable, one dimensional hexagonal-phase $M_xV_yS_z$ nanowire, wherein
   M=K, Rb, Cs;
   x=0.2 or 1.12;
   y=6;
   z=8,
   wherein the thermal stable, one dimensional hexagonal-phase $M_xV_yS_z$ nanowire, has c-axis-aligned hexagonal channels, and wherein the thermal stable, one dimensional hexagonal-phase $M_xV_yS_z$ nanowire exhibits an unchanged Raman spectrum in a temperature range of 30 to 300° C.

2. The thermal stable, one dimensional hexagonal-phase $M_xV_yS_z$ nanowire of claim 1, wherein the c-axis-aligned hexagonal channels have diameters in a range of 5 Å to 10 Å.

3. The thermal stable, one dimensional hexagonal-phase $M_xV_yS_z$ nanowire of claim 1, wherein the thermal stable, one dimensional hexagonal-phase $M_xV_yS_z$ nanowire functions as effective van der Waals contacts for $MoS_2$-based field-effect transistors, with good ohmic contact, large charge mobility, and reduced Fermi-level pinning effect.

4. The thermal stable, one dimensional hexagonal-phase $M_xV_yS_z$ nanowire of claim 1, wherein the $M_xV_yS_z$ nanowire has a thickness ranging from 1-15 nm.

5. The thermal stable, one dimensional hexagonal-phase $M_xV_yS_z$ nanowire of claim 1, wherein the $M_xV_yS_z$ nanowire is $K_{0.2}V_6S_8$, exhibiting five distinctive Raman peaks recorded at 532 nm, comprising 169.4, 221.5, 326.7, 340.0, and 374.1 $cm^{-1}$, respectively.

6. A thermal stable, one dimensional hexagonal-phase $K_xV_6S_ySes_{8-y}$ nanowire, wherein x=0.68 or 1.34;

y=7.02 or 6.79, wherein the thermal stable, one dimensional hexagonal-phase $M_xV_yS_z$ nanowire has c-axis-aligned hexagonal channels, and wherein the thermal stable, one dimensional hexagonal-phase $K_xV_6S_ySe_{8-y}$ nanowire exhibits an unchanged Raman spectrum in a temperature range of 30 to 300° C.

7. The thermal stable, one dimensional hexagonal-phase $K_xV_6S_ySe_{8-y}$ nanowire of claim 6, wherein the c-axis-aligned hexagonal channels have diameters in a range of 5 Å to 10 Å.

8. The thermal stable, one dimensional hexagonal-phase $K_xV_6S_ySe_{8-y}$ nanowire of claim 6, wherein the thermal stable, one dimensional hexagonal-phase $K_xV_6S_ySe_{8-y}$ nanowire functions as effective van der Waals contacts for $MoS_2$-based field-effect transistors, with good ohmic contact, large charge mobility, and reduced Fermi-level pinning effect.

9. The thermal stable, one dimensional hexagonal-phase $K_xV_6S_ySe_{8-y}$ nanowire of claim 7, wherein the $K_xV_6S_ySe_{8-y}$ nanowire is $K_{0.68}V_6S_{7.02}Se_{0.98}$, exhibiting five distinctive Raman peaks recorded at 532 nm, comprising 165.2, 221.3, 328.4, 337.9, and 375.7 $cm^{-1}$, respectively.

10. The thermal stable, one dimensional hexagonal-phase $K_xV_6S_ySe_{8-y}$ nanowire of claim 7, wherein the $K_xV_6S_ySe_{8-y}$ nanowire is $K_{1.34}V_6S_{6.79}Se_{1.21}$, exhibiting five distinctive Raman peaks recorded at 532 nm, comprising 157.5, 213.6, 328.4, 337.9, and 370.1 $cm^{-1}$, respectively.

11. A salt-assisted method for synthesizing one-dimensional hexagonal-phase vanadium sulfide nanowires on a substrate, comprising the steps of:

preparing a substrate;

providing a precursor by mixing vanadium (V) and sulfur(S) compounds;

introducing a metal salt to the precursor via a chemical vapor deposition (SA-CVD) method to obtained a mixture;

transferring the mixture to a quartz boat and covering two pieces of fresh-cleaved fluorophlogopite mica substrates on top of loaded mixture;

transferring the quartz boat to the center of a quartz tube, and then introducing Ar and $H_2$ to provide an optimal synthesis atmosphere;

heating the quartz tube and then cooling the quartz boat down to room temperature; and growing the one dimensional hexagonal-phase $M_xV_6S_8$ nanowires and $K_xV_6S_yS_{8-y}$ nanowires on the substrate.

12. The method of claim 11, wherein the ratio between the precursor and the metal salt is in a range of 1:1 to 1:1.5.

13. The method of claim 11, wherein step of providing a precursor comprises mixing $V_2S_3$ powders and S powders.

14. The method of claim 11, wherein the substrate comprises a mica substrate.

15. The method of claim 11, wherein the metal salt is selected from the group consisting of KCl, $K_2S$, $K_2CO_3$, $KHCO_3$, $K_2C_2O_4 \cdot H_2O$, $Rb_2CO_3$, and $Cs_2CO_3$.

16. The method of claim 11, wherein the quartz tube is purged with 500 s.c.c.m for 20 minutes in advance to remove internal air and moisture.

17. The method of claim 11, wherein the flow rate ratio between the Ar and $H_2$ is 4:1.

18. The method of claim 11, wherein the precursor further comprises Selenium (Se) compounds.

\* \* \* \* \*